US009028614B2

(12) United States Patent
Hara et al.

(10) Patent No.: US 9,028,614 B2
(45) Date of Patent: May 12, 2015

(54) SUBSTRATE PROCESSING APPARATUS

(75) Inventors: Daisuke Hara, Toyama (JP); Takeshi Itoh, Toyama (JP); Masanao Fukuda, Toyama (JP); Takatomo Yamaguchi, Toyama (JP); Hiroaki Hiramatsu, Toyama (JP); Shuhei Saido, Toyama (JP); Takafumi Sasaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/406,056

(22) Filed: Feb. 27, 2012

(65) Prior Publication Data
US 2012/0220108 A1 Aug. 30, 2012

(30) Foreign Application Priority Data

Feb. 28, 2011 (JP) .................................. 2011-042362
Feb. 6, 2012 (JP) .................................. 2012-023305

(51) Int. Cl.
*C23C 16/455* (2006.01)
*C23C 16/458* (2006.01)
(Continued)

(52) U.S. Cl.
CPC ........ *H01L 21/67109* (2013.01); *C23C 16/458* (2013.01); *C23C 16/4581* (2013.01); *C23C 16/4582* (2013.01); *C23C 16/4583* (2013.01); *C23C 16/4584* (2013.01); *C23C 16/4587* (2013.01); *C23C 16/4588* (2013.01); *C23C 16/46* (2013.01); *C30B 25/08* (2013.01); *C30B 25/14* (2013.01); *C30B 29/36* (2013.01); *H01L 21/67303* (2013.01); *H01L 21/67309* (2013.01); *H01L 21/67757* (2013.01);
(Continued)

(58) Field of Classification Search
CPC .......... C23C 16/458; C23C 16/4581–16/4584; C23C 16/4587–16/4588; C23C 16/46; H01L 21/67303
USPC ............. 118/730, 724, 725, 729; 156/345.52, 156/345.54, 345.55, 345.33
See application file for complete search history.

(56) References Cited

U.S. PATENT DOCUMENTS 3,603,284 A * 9/1971 Garnache ...................... 118/725
4,062,318 A * 12/1977 Ban et al. ...................... 118/725
(Continued)

FOREIGN PATENT DOCUMENTS

JP 09082656 A * 3/1997 ............. H01L 21/22
JP 2004235425 A * 8/2004 ............. H01L 21/31
(Continued)

OTHER PUBLICATIONS

Machine Translation for JP 2004235425 A.*

*Primary Examiner* — Rudy Zervigon
(74) *Attorney, Agent, or Firm* — Volpe and Koenig, P.C.

(57) ABSTRACT

When processing such as SiC epitaxial growth is performed at an ultrahigh temperature of 1500° C. to 1700° C., a film-forming gas can be decreased to heat-resistant temperature of a manifold and film quality uniformity can be improved. A substrate processing apparatus includes a reaction chamber for processing a plurality of substrates, a boat for holding the plurality of substrates, a gas supply nozzle for supplying a film-forming gas to the plurality of substrates, an exhaust port for exhausting the film-forming gas supplied into the reaction chamber, a heat exchange part which defines a second flow path narrower than a first flow path defined by an inner wall of the reaction chamber and the boat, and a gas discharge part installed under the lowermost substrate of the plurality of substrates.

1 Claim, 17 Drawing Sheets

(51) Int. Cl.
*C23C 16/46* (2006.01)
*H01L 21/67* (2006.01)
*C30B 25/08* (2006.01)
*C30B 25/14* (2006.01)
*C30B 29/36* (2006.01)
*H01L 21/673* (2006.01)
*H01L 21/677* (2006.01)
*C23C 16/32* (2006.01)
*C23C 16/44* (2006.01)

(52) U.S. Cl.
CPC .......... *C23C 16/325* (2013.01); *C23C 16/4405* (2013.01); *C23C 16/4412* (2013.01); *C23C 16/455* (2013.01)

(56) References Cited

U.S. PATENT DOCUMENTS

| | | | | |
|---|---|---|---|---|
| 4,539,933 A * | 9/1985 | Campbell et al. | | 118/719 |
| 4,989,540 A * | 2/1991 | Fuse et al. | | 118/719 |
| 5,016,567 A * | 5/1991 | Iwabuchi et al. | | 118/733 |
| 5,048,800 A * | 9/1991 | Miyazaki et al. | | 266/256 |
| 5,207,573 A * | 5/1993 | Miyagi et al. | | 432/182 |
| 5,239,614 A * | 8/1993 | Ueno et al. | | 392/416 |
| 5,308,955 A * | 5/1994 | Watanabe | | 219/390 |
| 5,320,680 A * | 6/1994 | Learn et al. | | 118/724 |
| 5,330,352 A * | 7/1994 | Watanabe et al. | | 432/152 |
| 5,370,371 A * | 12/1994 | Miyagi et al. | | 266/256 |
| 5,421,892 A * | 6/1995 | Miyagi | | 118/724 |
| 5,443,648 A * | 8/1995 | Ohkase | | 118/724 |
| 5,480,300 A * | 1/1996 | Okoshi et al. | | 432/241 |
| 5,480,678 A * | 1/1996 | Rudolph et al. | | 427/248.1 |
| 5,536,918 A * | 7/1996 | Ohkase et al. | | 219/390 |
| 5,578,132 A * | 11/1996 | Yamaga et al. | | 118/724 |
| 5,654,230 A * | 8/1997 | Jintate et al. | | 438/684 |
| 5,709,543 A * | 1/1998 | Shimazu | | 432/241 |
| 5,750,436 A * | 5/1998 | Yamaga et al. | | 438/558 |
| 5,777,300 A * | 7/1998 | Homma et al. | | 219/679 |
| 5,853,485 A * | 12/1998 | Rudolph et al. | | 118/715 |
| 5,908,292 A * | 6/1999 | Smith et al. | | 432/197 |
| 5,938,852 A * | 8/1999 | Nam et al. | | 118/724 |
| 5,947,718 A * | 9/1999 | Weaver | | 432/77 |
| 5,994,675 A * | 11/1999 | Bethune et al. | | 219/483 |
| 6,005,225 A * | 12/1999 | Kowalski et al. | | 219/390 |
| 6,142,773 A * | 11/2000 | Shimazu | | 432/241 |
| 6,187,102 B1 * | 2/2001 | Yamamoto | | 118/725 |
| 6,194,030 B1 * | 2/2001 | Psaute | | 427/248.1 |
| 6,259,061 B1 * | 7/2001 | Osawa | | 219/390 |
| 6,407,367 B1 * | 6/2002 | Ito et al. | | 219/390 |
| 6,444,262 B1 * | 9/2002 | Kitamura et al. | | 427/248.1 |
| 6,444,940 B1 * | 9/2002 | Saito et al. | | 219/390 |
| 6,464,930 B2 * | 10/2002 | An et al. | | 266/252 |
| 6,482,753 B1 * | 11/2002 | Tometsuka | | 438/758 |
| 6,607,381 B2 * | 8/2003 | Minami et al. | | 432/258 |
| 6,712,909 B2 * | 3/2004 | Tometsuka | | 118/725 |
| 6,737,613 B2 * | 5/2004 | Yamaguchi et al. | | 219/390 |
| 6,780,251 B2 * | 8/2004 | Tometsuka | | 118/725 |
| 6,884,295 B2 * | 4/2005 | Ishii et al. | | 118/715 |
| 7,027,722 B2 * | 4/2006 | Uemori et al. | | 392/416 |
| 7,102,104 B2 * | 9/2006 | Saito et al. | | 219/390 |
| 7,537,448 B2 * | 5/2009 | Saito et al. | | 432/81 |
| 7,575,370 B2 * | 8/2009 | Park et al. | | 374/1 |
| 7,632,354 B2 * | 12/2009 | Dip et al. | | 118/715 |
| 7,674,336 B2 * | 3/2010 | Honma et al. | | 118/715 |
| 7,727,296 B2 * | 6/2010 | Tojo et al. | | 55/385.1 |
| 7,795,157 B2 * | 9/2010 | Terasaki et al. | | 438/758 |
| 7,828,898 B2 * | 11/2010 | Maeda et al. | | 118/715 |
| 7,927,662 B2 * | 4/2011 | Matsuura | | 427/255.31 |
| 7,964,516 B2 * | 6/2011 | Okada et al. | | 438/787 |
| 8,030,599 B2 * | 10/2011 | Shimada | | 219/390 |
| 8,039,049 B2 * | 10/2011 | Lee et al. | | 427/248.1 |
| 8,043,431 B2 * | 10/2011 | Ozaki et al. | | 118/715 |
| 8,076,615 B2 * | 12/2011 | Morita et al. | | 219/390 |
| 8,148,271 B2 * | 4/2012 | Ueno et al. | | 438/748 |
| 8,166,914 B2 * | 5/2012 | Takahashi | | 118/723 E |
| 8,375,891 B2 * | 2/2013 | Nagata et al. | | 118/723 VE |
| 8,377,206 B2 * | 2/2013 | Park et al. | | 118/715 |
| 8,398,773 B2 * | 3/2013 | Jdira et al. | | 118/724 |
| 8,466,045 B2 * | 6/2013 | Gumpher et al. | | 438/478 |
| 8,741,063 B2 * | 6/2014 | Yamazaki et al. | | 118/715 |
| 2001/0004140 A1 * | 6/2001 | An et al. | | 266/252 |
| 2001/0013504 A1 * | 8/2001 | Imafuku et al. | | 216/71 |
| 2002/0168854 A1 * | 11/2002 | Tometsuka | | 438/680 |
| 2003/0015138 A1 * | 1/2003 | Tometsuka | | 118/715 |
| 2003/0183614 A1 * | 10/2003 | Yamaguchi et al. | | 219/390 |
| 2005/0098107 A1 * | 5/2005 | Du Bois et al. | | 118/715 |
| 2006/0150904 A1 * | 7/2006 | Ozaki et al. | | 118/715 |
| 2007/0062448 A1 * | 3/2007 | Maeda et al. | | 118/715 |
| 2007/0084406 A1 * | 4/2007 | Yudovsky et al. | | 118/724 |
| 2007/0195853 A1 * | 8/2007 | Park et al. | | 374/1 |
| 2007/0231757 A1 * | 10/2007 | Dip et al. | | 431/174 |
| 2008/0035055 A1 * | 2/2008 | Dip et al. | | 118/715 |
| 2008/0213478 A1 * | 9/2008 | Matsuura | | 427/255.28 |
| 2009/0004405 A1 * | 1/2009 | Merry et al. | | 427/585 |
| 2009/0032190 A1 * | 2/2009 | Takahashi | | 156/345.33 |
| 2009/0035463 A1 * | 2/2009 | Dip | | 427/255.26 |
| 2009/0170338 A1 * | 7/2009 | Terasaki et al. | | 438/758 |
| 2009/0188431 A1 * | 7/2009 | Ozaki et al. | | 118/719 |
| 2009/0197409 A1 * | 8/2009 | Morita et al. | | 438/680 |
| 2009/0291566 A1 * | 11/2009 | Ueno et al. | | 438/758 |
| 2009/0305512 A1 * | 12/2009 | Matsuura et al. | | 438/558 |
| 2009/0308315 A1 * | 12/2009 | De Ridder | | 118/715 |
| 2010/0050945 A1 * | 3/2010 | Morita et al. | | 118/733 |
| 2010/0263594 A1 * | 10/2010 | Na et al. | | 118/725 |
| 2010/0275848 A1 * | 11/2010 | Fukuda et al. | | 118/728 |
| 2010/0297832 A1 * | 11/2010 | Imai et al. | | 438/478 |
| 2012/0000425 A1 * | 1/2012 | Park et al. | | 118/724 |
| 2012/0103260 A1 * | 5/2012 | Park et al. | | 118/724 |
| 2012/0186573 A1 * | 7/2012 | Jdira et al. | | 126/58 |
| 2013/0042803 A1 * | 2/2013 | Saido et al. | | 117/88 |
| 2013/0327273 A1 * | 12/2013 | Okada | | 118/715 |

FOREIGN PATENT DOCUMENTS

| | | | | |
|---|---|---|---|---|
| JP | 2005209813 A | * | 8/2005 | ............. H01L 21/22 |
| JP | 2007123421 A | * | 5/2007 | |

* cited by examiner

FIG. 2
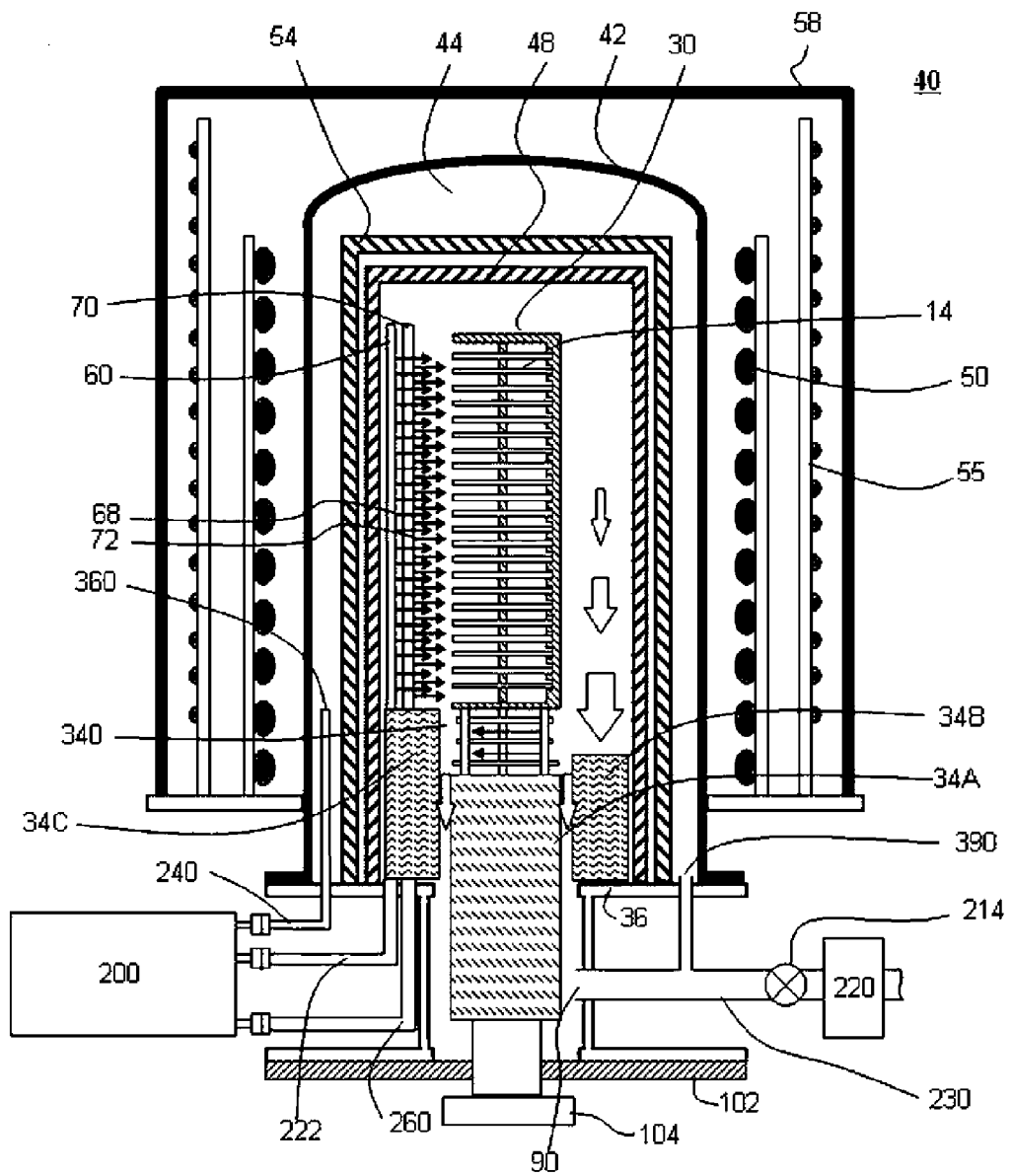
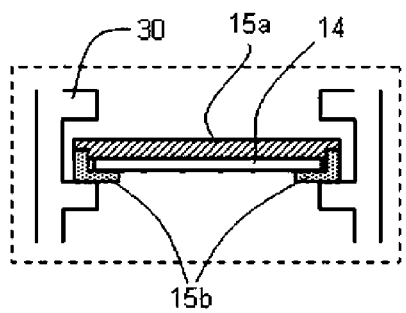

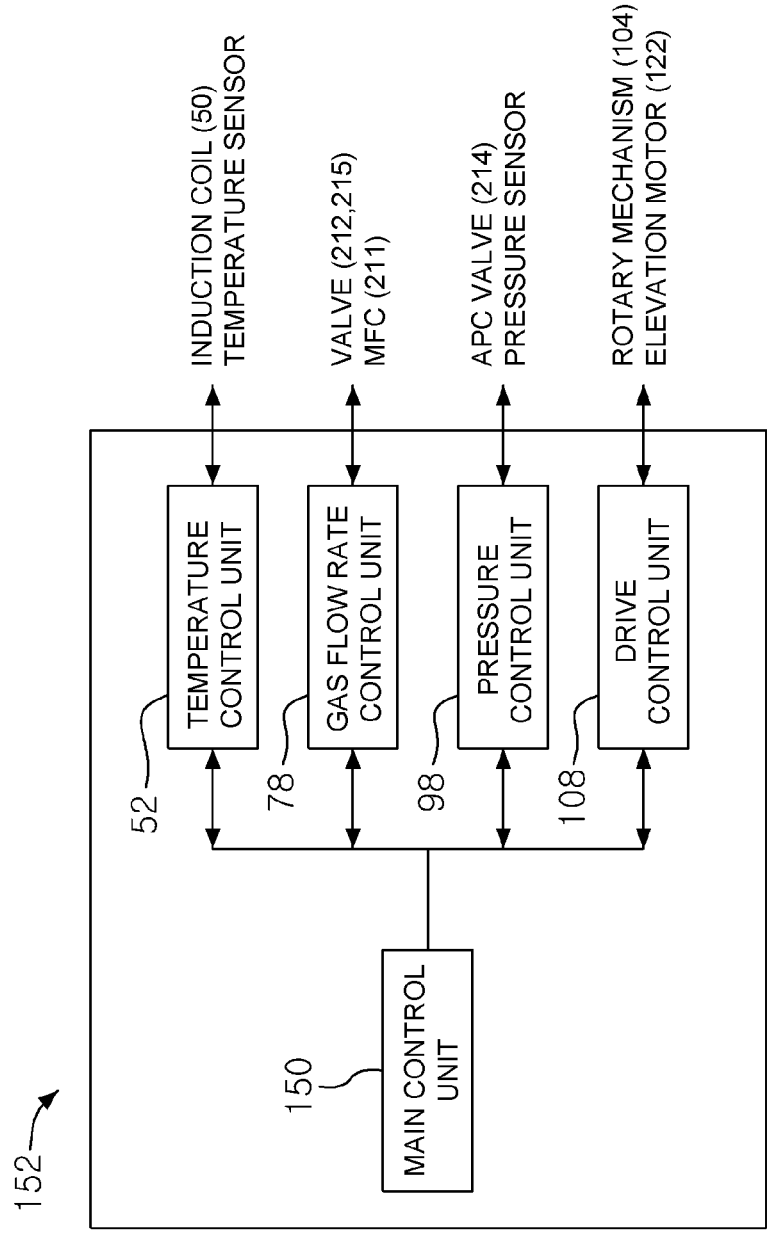

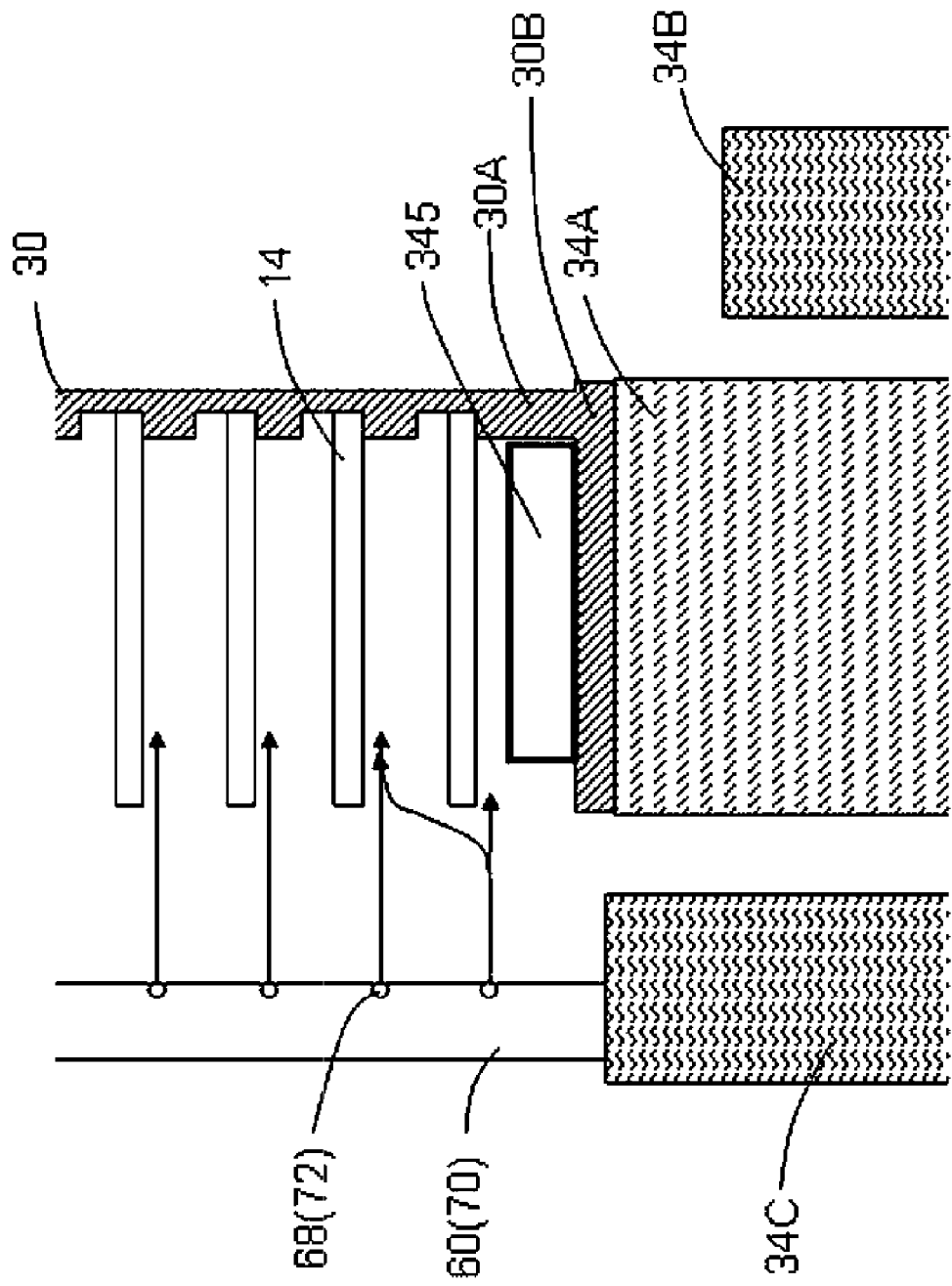

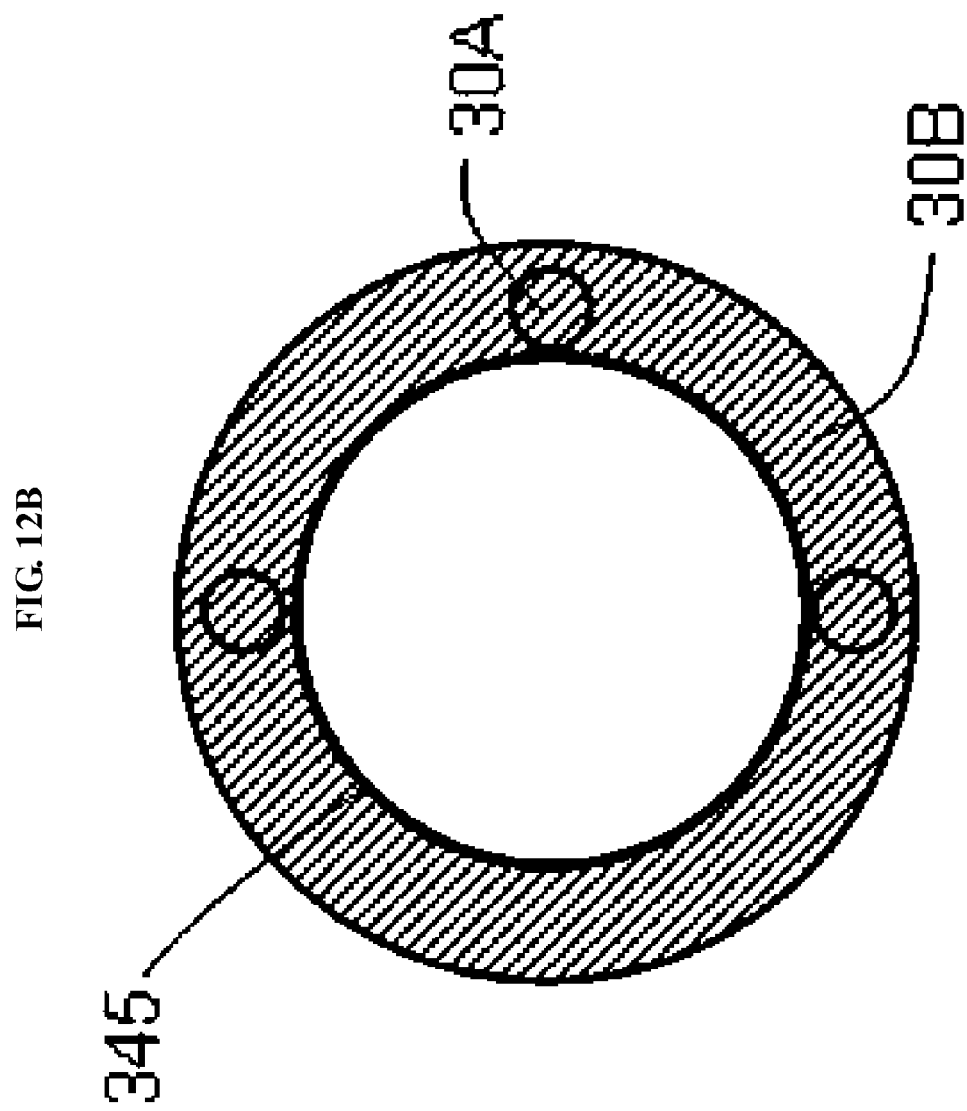

SUBSTRATE PROCESSING APPARATUS

CROSS-REFERENCE TO RELATED PATENT APPLICATION

This U.S. non-provisional patent application claims priority under 35 U.S.C. §119 of Japanese Patent Applications No. 2011-0423623, filed on Feb. 28, 2011 and No. 2012-023305, filed on Feb. 6, 2012, in the Japanese Patent Office, the entire contents of which are hereby incorporated by reference.

BACKGROUND OF THE INVENTION

1. Field of the Invention

The present invention relates to a substrate processing apparatus configured to process a substrate, a method of manufacturing a semiconductor device and a method of manufacturing a substrate, and more particularly, to a substrate processing apparatus, a method of manufacturing a semiconductor device and a method of manufacturing a substrate, including a process of forming a silicon carbide (hereinafter referred to as SiC) epitaxial film on the substrate.

2. Description of the Related Art

SiC is attracting attention as, in particular, a power device material. Meanwhile, it is known that SiC is difficult to manufacture as a crystalline substrate or device, in comparison with silicon (hereinafter referred to as Si).

Meanwhile, when a device is manufactured using SiC, a wafer in which a SiC epitaxial film is formed on a SiC substrate is used. Patent Document 1 discloses an example of a SiC epitaxial growth apparatus for forming a SiC epitaxial film on a SiC substrate.

Patent Document 1 discloses a configuration that can process a large number of SiC substrates simultaneously using a batch-type vertical thermal processing apparatus. In addition, Patent Document 1 discloses a boat insulating part, which is an insulating member, configured to make it difficult for heat from a susceptor to be transferred to a lower side of a processing furnace.

RELATED ART DOCUMENT

Patent Document

1. Japanese Patent Laid-open Publication No. 2011-3885

SUMMARY OF THE INVENTION

However, in order to form a SiC epitaxial film, as disclosed in Patent Document 1, processing at an ultrahigh temperature of 1,500° C. to 1,700° C. is needed. Here, in the apparatus disclosed in Patent Document 1, a film-forming gas passing through a processing furnace is exhausted through an exhaust pipe installed at a lower side of the processing furnace. Since the exhaust pipe is installed at a manifold, a temperature of the film-forming gas needs to be lowered to a heat-resistant temperature of the manifold.

According to one aspect of the present invention, there is provided a substrate processing apparatus including: a reaction chamber configured to process a plurality of substrates; a boat configured to hold the plurality of substrates; a gas supply nozzle including a gas supply port configured to supply a film-forming gas to the plurality of substrates; an exhaust port configured to exhaust the film-forming gas from the reaction chamber; a heat exchange part installed at a lower portion of the reaction chamber, the heat exchange part defining a second flow path narrower than a first flow path defined by an inner wall of the reaction chamber and the boat; and a gas discharge part installed below a lowermost substrate of the plurality of substrates loaded in the boat, the gas discharge part including a plurality of columns defining a space between the lowermost substrate and the heat exchange part.

According to another aspect of the present invention, there is provided a substrate processing apparatus including: a reaction chamber configured to process a plurality of substrates; a boat configured to hold the plurality of substrates; a gas supply nozzle including a gas supply port configured to supply a film-forming gas to the plurality of substrates; an exhaust port configured to exhaust the film-forming gas from the reaction chamber; a heat exchange part installed at a lower portion of the reaction chamber, the heat exchange part defining a second flow path narrower than a first flow path defined by an inner wall of the reaction chamber and the boat; and an adjustment block disposed on a bottom plate of the boat.

According to still another aspect of the present invention, there is provided a method of manufacturing a substrate or a method of manufacturing a semiconductor device, including: (a) loading into a reaction chamber a boat holding a plurality of substrates; (b) supplying a film-forming gas to the plurality of substrate in the reaction chamber to process the plurality of substrates; (c) exhausting the film-forming gas in the reaction chamber via a first flow path defined by an inner wall of the reaction chamber and the boat and a second flow path narrower than the first flow path defined by a space under the boat and a heat exchange part; and (d) unloading the plurality of substrates from the reaction chamber.

According to the present invention, a uniform film can be formed on a substrate.

BRIEF DESCRIPTION OF THE DRAWINGS

FIG. 2 is a side cross-sectional view of a processing furnace for explaining a first embodiment;

FIG. 7 is a block diagram showing a control configuration of the semiconductor manufacturing apparatus to which the present invention is applied;

FIGS. 12A and 12B are schematic views of a processing furnace for explaining a third embodiment;

DETAILED DESCRIPTION OF THE PREFERRED EMBODIMENTS

Hereinafter, an exemplary embodiment of the present invention will be described with reference to the accompanying drawings. In the embodiment described below, a SiC epitaxial growth apparatus, which is an example of a substrate processing apparatus, is known as a batch type vertical SiC epitaxial growth apparatus in which SiC wafers are arranged in a height direction. In addition, as the batch type vertical SiC epitaxial growth apparatus is provided, the number of SiC wafers that can be processed simultaneously is increased to improve throughput.

First Embodiment

<Entire Configuration>

Figure 1:
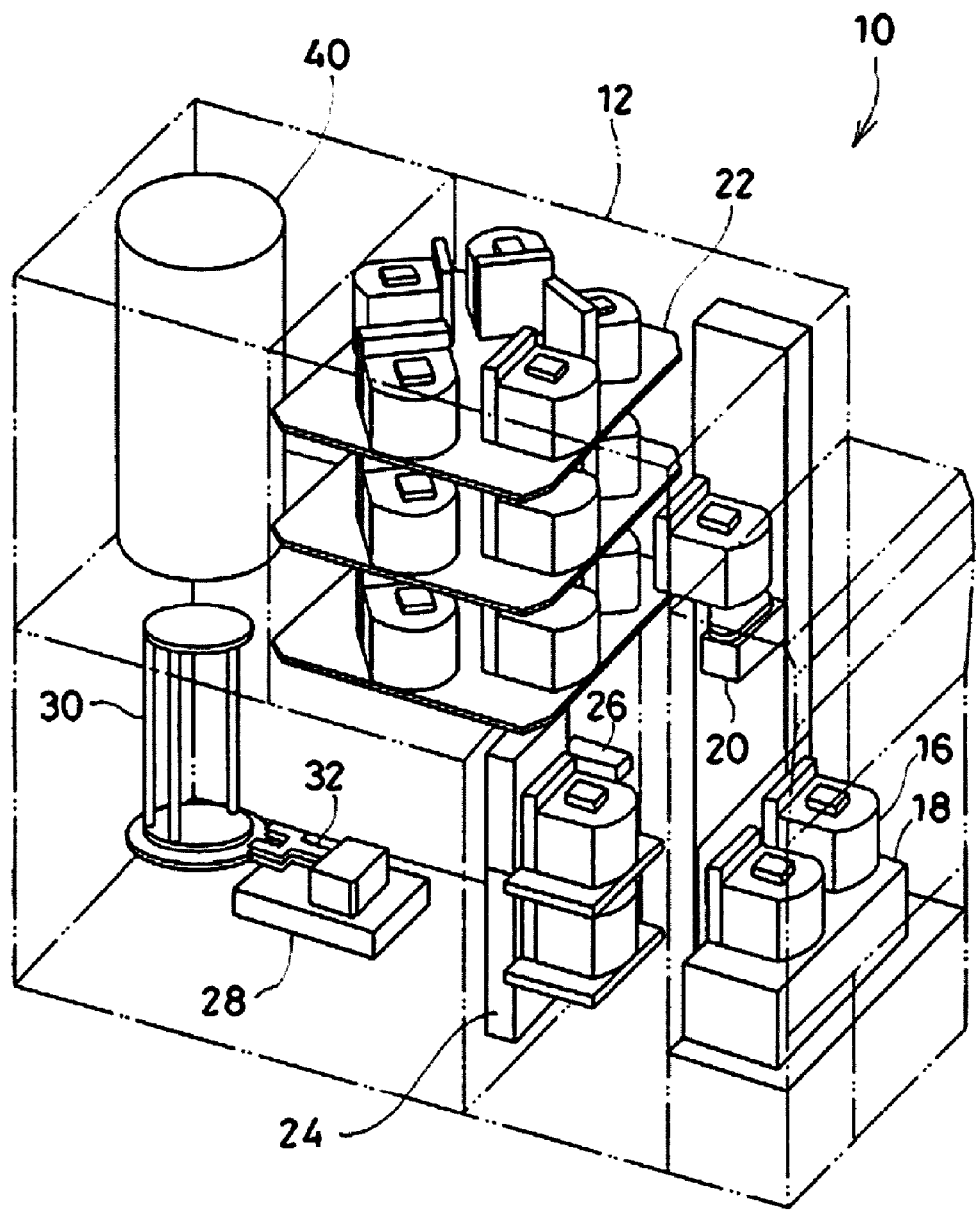
FIG. 1 is a perspective view of a semiconductor manufacturing apparatus to which the present invention is applied.

First, in FIG. 1, a substrate processing apparatus for forming a SiC epitaxial film and a method of manufacturing a substrate to form a SiC epitaxial film, which is one part of a process of manufacturing a semiconductor device, in a first embodiment of the present invention will be described.

A semiconductor manufacturing apparatus 10, which is a substrate processing apparatus (a film-forming apparatus), is a batch-type vertical thermal processing apparatus, and includes a housing 12 in which major parts are disposed. In the semiconductor manufacturing apparatus 10, for example, a FOUP (hereinafter, referred to as a pod) 16, which is a substrate accommodating vessel to accommodate a wafer 14 (see FIG. 2), which is a substrate formed of SiC, is used as a wafer carrier. A pod stage 18 is disposed in the front of the housing 12, and the pod 16 is conveyed to the pod stage 18. For example, 25 wafers are received in the pod 16 and set to the pod stage 18 with its cover closed.

A pod conveyance apparatus 20 is arranged in the front of the housing 12 at a position opposite to the pod stage 18. In addition, a pod receiving shelf 22, a pod opener 24 and a substrate number detector 26 are disposed adjacent to the pod conveyance apparatus 20. The pod receiving shelf 22 is disposed over the pod opener 24, and configured to hold a plurality of pods 16 placed thereon. The substrate number detector 26 is disposed adjacent to the pod opener 24, and the pod conveyance apparatus 20 conveys the pod 16 between the pod stage 18, the pod receiving shelf 22 and the pod opener 24. The pod opener 24 opens a cover of the pod 16, and the substrate number detector 26 detects the number of wafers 14 in the pod 16 with its cover opened.

A substrate transfer apparatus 28 and a boat 30, which is a substrate holding member, are disposed in the housing 12. The substrate transfer apparatus 28 includes an arm (tweezers) 32 and has a structure which is rotatably raised and lowered by a driving unit (not shown). The arm 32 can extract, for example, 5 wafers, and as the arm 32 is moved, the wafer 14 is conveyed between the pod 16 disposed at a position of the pod opener 24 and the boat 30.

The boat 30 is formed of a heat-resistant material such as carbon graphite or SiC, and configured to concentrically align a plurality of wafers 14 in a horizontal posture to stack and hold the wafers 14 in a longitudinal direction thereof. In addition, a boat insulating part 34A, which is a cylindrical insulating part formed of a heat-resistant material such as quartz or SiC, is disposed at a lower portion of the boat 30 so that heat from a body to be heated 48 cannot be easily transferred to a lower side of a processing furnace 40 (see FIG. 2).

The processing furnace 40 is disposed at a rear upper side of the housing 12. The boat 30 in which the plurality of wafers 14 are charged is loaded into the processing furnace 40 and then the wafers 14 are thermally processed.

<Configuration of Processing Furnace>

Next, the processing furnace 40 of the semiconductor manufacturing apparatus 10 for forming a SiC epitaxial film in accordance with the first embodiment will be described with reference to FIGS. 2 to 7. A first gas supply nozzle 60 including a first gas supply port 68, a second gas supply nozzle 70 including a second gas supply port 72, and a first gas exhaust port 90 are installed at the processing furnace 40. In addition, a third gas supply port 360 configured to supply an inert gas and a second gas exhaust port 390 are shown.

The processing furnace 40 includes a reaction tube 42 formed of a heat-resistant material such as quartz or SiC and having a cylindrical shape with an upper end closed and a lower end opened. A manifold 36 is disposed at a lower side of the reaction tube 42 in a concentric shape with the reaction tube 42. The manifold 36 is formed of stainless steel, etc., and has a cylindrical shape with upper and lower ends opened. The manifold 36 is installed to support the reaction tube 42. In addition, an O-ring (not shown), which is a seal member, is installed between the manifold 36 and the reaction tube 42. The manifold 36 is supported by a holding body (not shown) so that the reaction tube 42 is vertically installed. A reaction vessel is defined by the reaction tube 42 and the manifold 36.

The processing furnace 40 includes a body to be induced 48 having a cylindrical shape with an upper end closed and a lower end opened, and an induction coil 50, which is a magnetic field generating part. A reaction chamber 44 is formed in a hollow cylindrical part of the body to be induced 48, and configured to accommodate the boat 30 in which the wafer 13, which is a substrate formed of SiC, is held. In addition, as shown in a lower portion of FIG. 2, the wafer 14 may be held on the boat 30 in a state in which the wafer 14 is held on a lower wafer holder 15b having an annular shape and covered by an upper wafer holder 15a having a disc shape at its upper surface. Accordingly, the wafer 14 can be protected from particles dropped from above the wafer, and film-forming on a rear surface of a film-forming surface (a lower surface of the wafer 14) can be suppressed. Further, the film-forming surface can be separated from a boat column to an extent of the wafer holder 15b, and influence due to the boat column can be reduced. The boat 30 holds the wafers 14 held by the wafer holders 15a and 15b such that the wafers are concentrically aligned in a horizontal posture in a longitudinal direction thereof. The body to be induced 48 is heated by a magnetic field generated by an induction coil 50 installed at the outside of the reaction tube 42, and the inside of the reaction chamber 44 is heated as the body to be induced 48 generates heat.

A temperature sensor (not shown), which is a temperature detecting body configured to detect a temperature in the reaction chamber 44, is disposed adjacent to the body to be induced 48. The induction coil 50 and temperature sensor are electrically connected to a temperature control unit 52, and as a conduction state to the induction coil 50 is adjusted based on temperature information detected by the temperature sensor, the temperature in the reaction chamber 44 is controlled to a desired temperature distribution at a predetermined timing (see FIG. 7).

Figure 3:
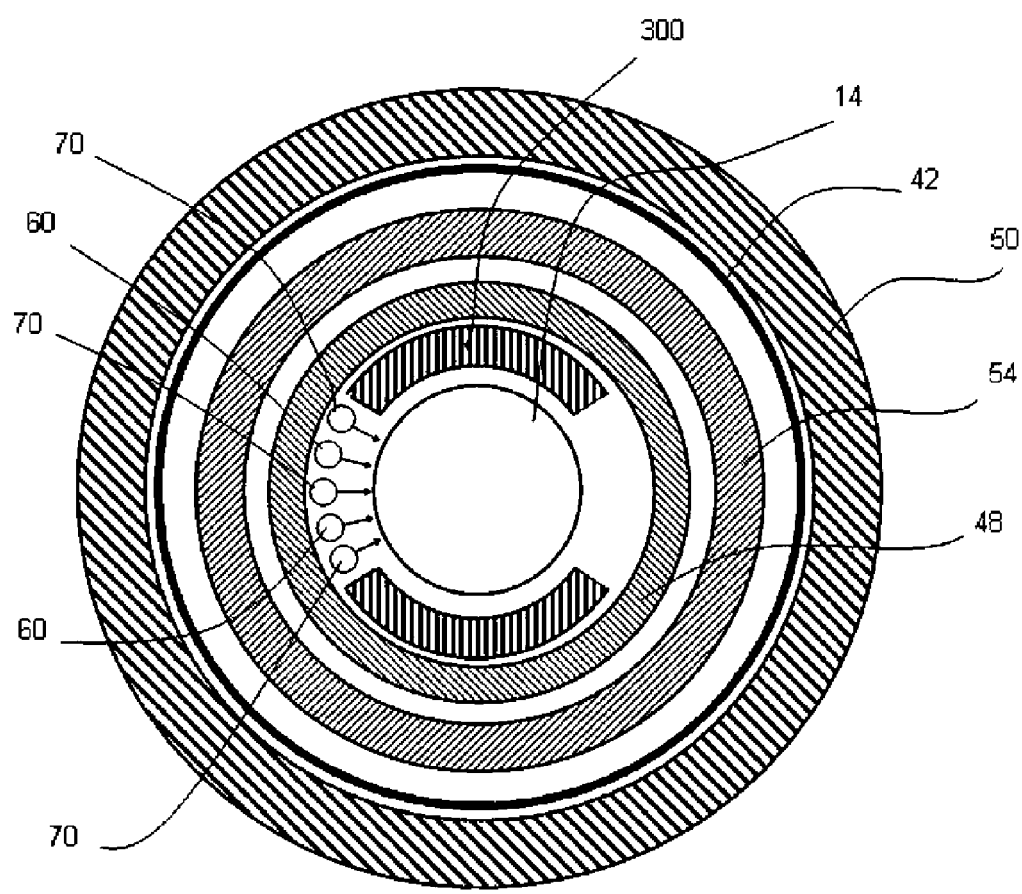
FIG. 3 is a planar cross-sectional view of a processing furnace to which the present invention is applied.

Meanwhile, preferably, structures 300 extending in a vertical direction and having an arc-shaped cross section to fill a space between the body to be heated 48 and the wafer 14 may be installed between the body to be heated 48 and the wafer 14 in the reaction chamber 44, that is, between the first and second gas supply nozzles 60 and 70 and the first gas exhaust port 90 in the reaction chamber 44. For example, as shown in FIG. 3, the structures 300 may be installed at opposite positions to prevent a gas supplied through the first and second gas supply nozzles 60 and 70 from bypassing the wafer 14 along an inner wall of the body to be induced 48. Preferably, when the structures 300 are formed of carbon graphite, heat resistance can be improved and generation of particles can be suppressed.

An insulating material 54 formed of carbon felt, in which electricity cannot be easily induced, is installed between the reaction tube 42 and the body to be induced 48. As the insulating material 54 is installed, transfer of heat from the body to be induced 48 to the reaction tube 42 or the outside of the reaction tube 42 can be suppressed.

In addition, an outer insulating wall 55 having a water cooling structure configured to suppress transfer of heat in the reaction chamber 44 to the outside is installed outside the induction coil 50 to surround the reaction chamber 44. Further, a magnetic seal 58 configured to prevent a leakage of a magnetic field generated by the induction coil 50 to the outside is installed outside the outer insulating wall 55.

As shown in FIG. 2, the first gas supply nozzle 60, in which at least one first gas supply port 68 is installed, is installed between the body to be induced 48 and the wafer 14. In addition, the second gas supply nozzle 70, in which at least one second gas supply port 72 is installed, is installed between the body to be induced 48 and the wafer 14 at a different position than the first gas supply nozzle 60. Further, similarly, the first gas exhaust port 90 is also disposed between the body to be heated 48 and the wafer 14. Furthermore, the third gas supply port 360 and the second gas exhaust port 390 are disposed between the reaction tube 42 and the insulating material 54.

In addition, while one each of the first gas supply nozzle 60 and the second gas supply nozzle 70 may be provided, as shown in FIG. 3, three second gas supply nozzles 70 may be installed and the first gas supply nozzles 60 may be installed to be disposed between the second gas supply nozzles 70. As the nozzles are alternately disposed, even when different gas species are supplied through the first gas supply nozzles 60 and the second gas supply nozzles 70, mixing of the different gas species can be promoted. Further, when the first gas supply nozzles and the second gas supply nozzles are provided in an odd number, film-forming gases can be symmetrically supplied about a center second gas supply nozzle 70, and uniformity in the wafer 14 can be increased. Furthermore, the gas species supplied through the first gas supply nozzles 60 and the second gas supply nozzles 70 will be described later.

The first gas supply port 68 and the first gas supply nozzle 60 are formed of, for example, carbon graphite, and installed in the reaction chamber 44. In addition, the first gas supply nozzle 60 is installed at the manifold 36 to pass through the manifold 36. The first gas supply nozzle 60 is connected to a gas supply unit 200 via a first gas line 222.

The second gas supply port 72 is formed of, for example, carbon graphite, and installed in the reaction chamber 44. Further, the second gas supply nozzle 70 is installed at the manifold 36 to pass through the manifold 36. Furthermore, the second gas supply nozzle 70 is connected to the gas supply unit 200 via a second gas line 260.

In addition, in the first gas supply nozzle 60 and the second gas supply nozzle 70, each one of the first gas supply port 68 and the second gas supply port 72 may be installed in a substrate arrangement region, or may be installed to correspond to each of the wafers 14.

<Exhaust System>

As shown in FIG. 2, the first gas exhaust port 90 is installed under the boat 30, and a gas exhaust pipe 230 connected to the first gas exhaust port 90 is installed to pass through the manifold 36. A vacuum exhaust apparatus 220 such as a vacuum pump is connected to a downstream side of the gas exhaust pipe 230 via a pressure sensor (not shown), which is a pressure detector, and an automatic pressure controller (APC) valve 214, which is a pressure regulator. A pressure control unit 98 is electrically connected to the pressure sensor and the APC valve 214, and the pressure control unit 98 is configured to adjust an opening angle of the APC valve 214 based on the pressure detected by the pressure sensor and control the pressure in the processing furnace 40 to a predetermined pressure at a predetermined timing (see FIG. 7).

Figure 4:
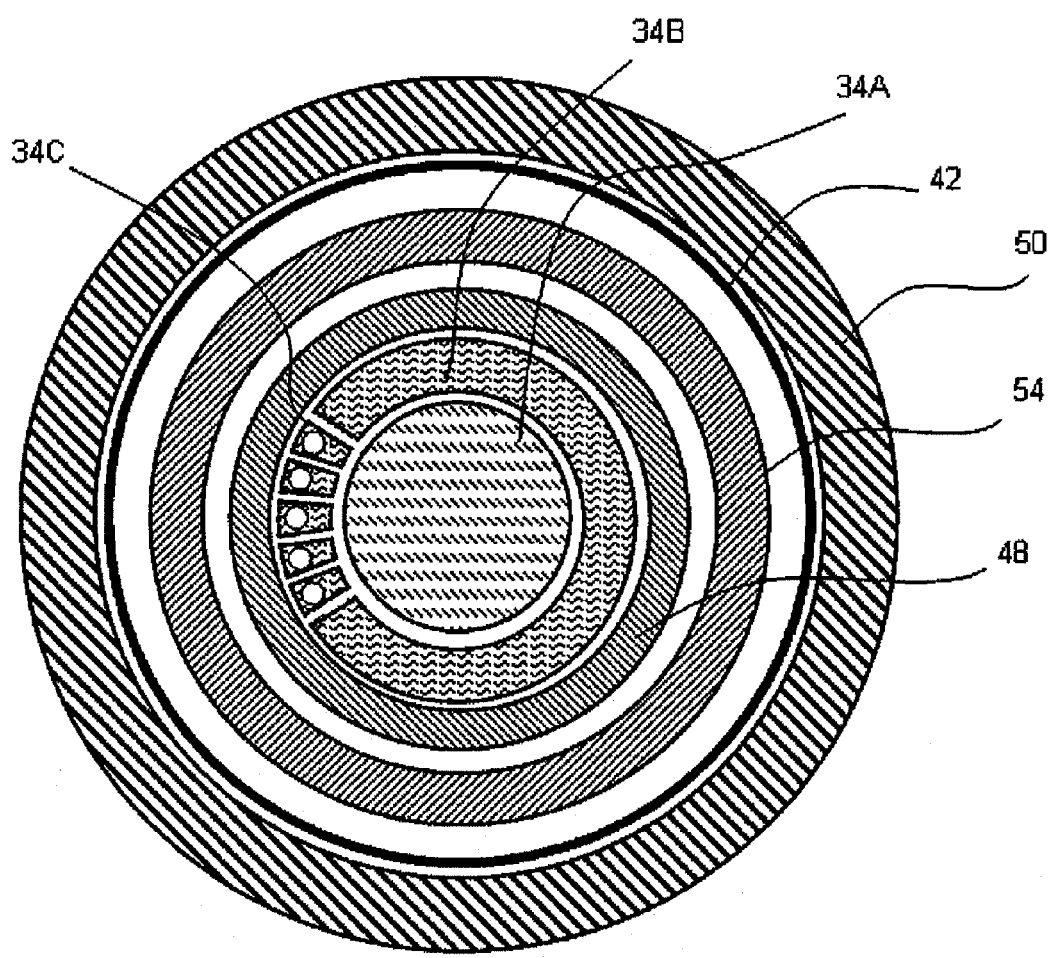
FIG. 4 is another planar cross-sectional view of the processing furnace to which the present invention is applied.

In addition, as shown in FIGS. 2 and 4, a first heat exchange part 34B installed to surround a boat insulating part 34A, and a second heat exchange parts 34C installed at each of the gas supply nozzles are provided. The first heat exchange part 34B and the second heat exchange part 34C are installed to have a gap between the boat insulating part 34A and the heat exchange parts, and configured to flow a film-forming gas supplied via the reaction chamber 44 into the first gas exhaust port 90 via the gap. As the first heat exchange part 34B and the second heat exchange part 34C are installed to narrow a flow path, through which a film-forming gas flows, in comparison with a flow path through which the film-forming gas flows in the reaction chamber 44, the heated film-forming gas flowing via the reaction chamber 44 is actively heat exchanged with the boat insulating part 34A, the first heat exchange part 34B and the second heat exchange part 34C so that a temperature of the film-forming gas can be reduced. In particular, the boat insulating part 34A, the first heat exchange part 34B and the second heat exchange part 34C have a cylindrical shape including a sidewall to increase a contact area with the film-forming gas flowing through the gap, improving heat exchange efficiency. In addition, a heat exchange part is constituted by the boat insulating part 34A, the first heat exchange part 34B and the second heat exchange part 34C.

Further, while the boat insulating part 34A, the first heat exchange part 34B and the second heat exchange part 34C may have a solid cylindrical shape, they may also have a hollow cylindrical shape because downward heat transfer due to their thermal conductivity can be suppressed. Furthermore, in the case of the hollow cylindrical shape, as a plate-shaped member is installed in a direction parallel to a wafer surface, radiant heat from the reaction chamber 44 can be suppressed to improve an insulating effect. In addition, as the second heat exchange part 34C is installed as a separate member from the first heat exchange part 34B and installed at the gas supply nozzle, the gas supply nozzle can be easily installed to improve maintenance thereof. In addition, according to its structure, the first heat exchange part 34B may be installed in an annular shape as long as the gap through which the film-forming gas flows is reduced.

Figure 8:
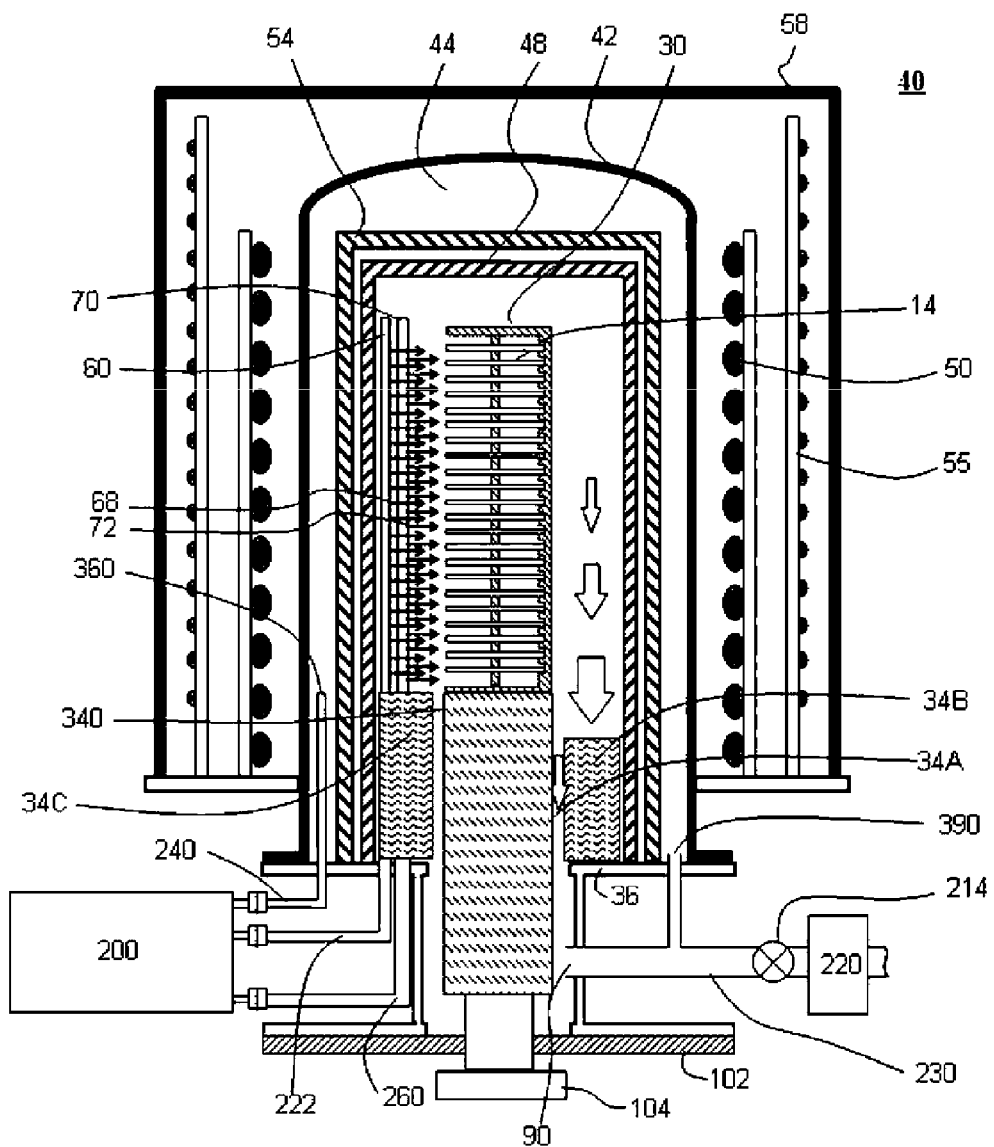
FIG. 8 shows a comparative example of a side cross-sectional view of the processing furnace for explaining effects of the present invention.

Furthermore, in the embodiment, a gas discharge part 340 is installed between the boat insulating part 34A and boat 30. Advantages of the gas discharge part 340 will be described with reference to FIG. 8. FIG. 8 shows a structure having no gas discharge part 340 and in which the boat 30 is directly installed on the boat insulating part 34A, unlike FIG. 2. Here, as described above, the film-forming gas supplied via the gas supply ports 68 and 72 mainly flows parallel to the wafer 14, flows toward an opposite side of a space in which the gas supply nozzles 60 and 70 are installed, and then, flows downward. Accordingly, a flow rate of the film-forming gas to be exhausted is increased as it flows downward. In addition, the film-forming gas flowing downward flows through the gap formed in the circumferential direction of the boat insulating part 34A (see FIG. 3). Here, the gap formed in the circumferential direction of the boat insulating part 34A has a small dimension to increase heat exchange efficiency. Accordingly, the film-forming gas flowing to an opposite side of the gas supply nozzle cannot easily flow in the circumferential direction, and its pressure is locally increased at an upper side of the first heat exchange part 34B. As a result, the film-forming gas supplied through the gas supply port disposed at a lower side of the gas supply nozzle joins an upper side of the first heat exchange part 34B in which a pressure is locally high, and thus, a flow velocity of the joined gas may be decreased (hereinafter referred to as "confluence loss"), in comparison with the film-forming gas supplied through the gas supply port disposed at an upper side of the gas supply nozzle. When the confluence loss is increased, even though the structure is designed such that the flow velocities of the film-forming gases supplied through the plurality of gas supply ports are substantially the same as each other, the flow velocities of the film-forming gases become different at the wafer disposed at an upper side of the boat 30 and the wafer disposed at a lower side of the boat 30 and uniformity between the wafers deteriorates.

Meanwhile, in the embodiment, the gas discharge part 340 is installed between the boat insulating part 34A and the boat 30. The gas discharge part 340 is constituted by installing a plurality of columns between the boat insulating part 34A and the boat 30. Accordingly, the film-forming gas arriving at the upper side of the first heat exchange part 34B can flow to an opposite side thereof through a space formed in the gas discharge part 340, and can suppress an increase in local pressure at the upper side of the first heat exchange part 34B. As a result, the confluence loss of the film-forming gas supplied through the gas supply port disposed at the lower side of the gas supply nozzle can be suppressed to improve the uniformity in quality between the wafers.

Figure 5:
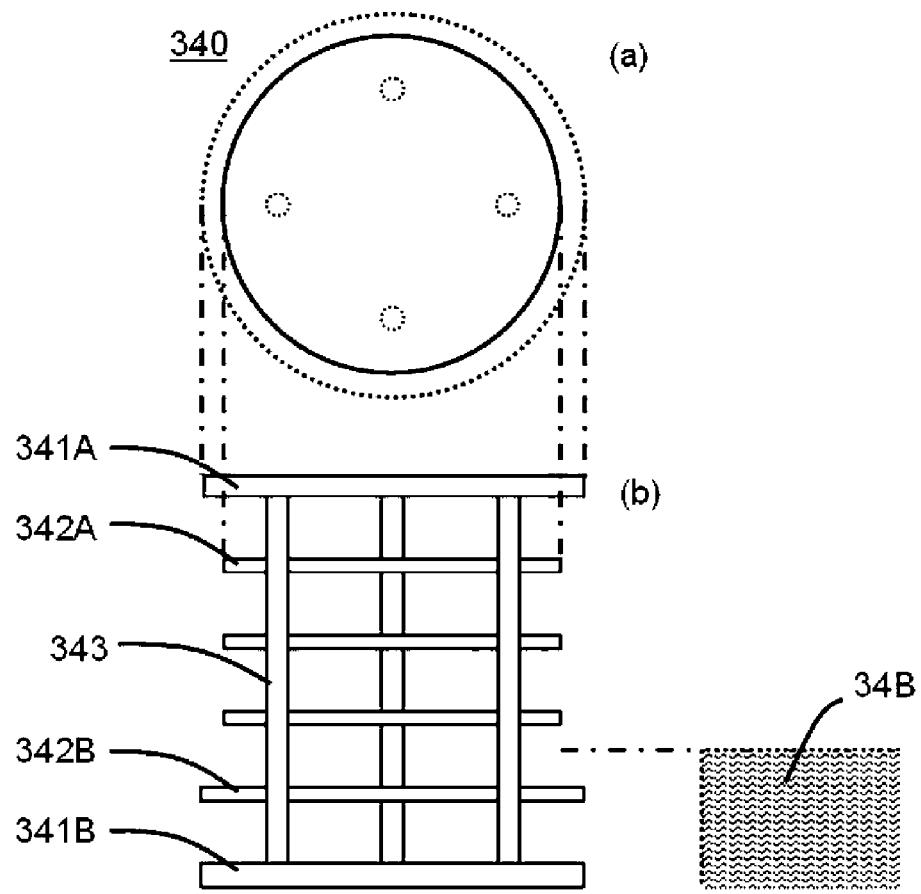
FIG. 5 is a schematic view of a gas discharge part in accordance with the first embodiment.

In addition, FIG. 5 shows a detailed view of the gas discharge part 340. A portion (a) of FIG. 5 shows a plan view of the gas discharge part 340, and a portion (b) of FIG. 5 shows a side cross-sectional view thereof. As shown in FIG. 5, the gas discharge part 340 includes four columns 343 between a top plate 341A and a bottom plate 341B and forms a space through which the film-forming gas passes between the boat insulating part 34A and the boat 30 to suppress the confluence loss.

Further, disc-shaped insulating plates 342A and 342B are installed between the top plate 341A and the bottom plate 341B. Accordingly, transfer of radiant heat from the reaction chamber 44 to a lower portion thereof can be suppressed, and a furnace port having a low heat-resistance can be protected.

Furthermore, as shown in FIG. 2, the gas discharge part 340 may be configured such that an upper end of the boat insulating part 34A is substantially equal to or lower than that of the first heat exchange part 34B. Accordingly, a flow path in which the film-forming gas flowing over the first heat exchange part 34B flows in a direction of the gas discharge part 340 is increased to suppress a decrease in local pressure.

In addition, the gas discharge part 340 not only temporarily reduces the pressure by discharging the film-forming gas flown to a lower side of the reaction chamber 44, but also cools the film-forming gas of high-temperature more efficiently by temporarily retaining the film-forming gas in the gas discharge part 340, thereby enhancing an efficiency of a heat exchange with the heat exchange part.

Meanwhile, when the second heat exchange part 34C installed under the gas supply nozzles 60 and 70 is included, an upper end of the second heat exchange part 34C may be higher than that of the first heat exchange part 34B (or higher than that of the boat insulating part 34A). Accordingly, the film-forming gas flowing over the first heat exchange part 34B passes through the gas discharge part 340, collides with a side surface of the second heat exchange part 34C, and then, flows downward along the side surface of the second heat exchange part 34C. Therefore, a contact area between the film-forming gas flowing downward and the side surface of the second heat exchange part 34C is increased, and thus, heat exchange between the film-forming gas having an ultrahigh temperature and the second heat exchange part 34C is increased. Meanwhile, since the second heat exchange part is installed under the gas supply nozzles 60 and 70, the film-forming gas passes through the inside thereof. Accordingly, heat transferred to the second heat exchange part 34C by the exhausted film-forming gas may be used to heat the film-forming gas passing through the inside of the second heat exchange part 34C.

In addition, insulating plates 342A and 342B may have an outer diameter smaller than that of the bottom plate of the boat 30. Accordingly, since a space in which the film-forming gas passing through the bottom plate of the boat 30 (or the top plate 341A of the gas discharge part 340) is directed in a lateral direction can be increased, a flow in the lateral direction can be easily formed. Meanwhile, when the upper end of the boat insulating part 34A is lower than that of the first heat exchange part 34B, as shown in FIG. 5, an outer diameter of the insulating plate 342B, which is lower than the upper end of the first heat exchange part 34B, may be larger than that of the insulating plate 342A, which is higher than the upper end of the first heat exchange part 34B. While the film-forming gas flowing over the first heat exchange part 34B flows toward the gas discharge part 340 in the lateral direction, the film-forming gas cannot easily flow through a position lower than the upper end of the first heat exchange part 34B, because the film-forming gas needs to pass through a narrow space between the disc-shaped insulating plates 342A and 342B and the first heat exchange part 34B. For this reason, instead of an increase in flow rate of the film-forming gas flowing through the space under the insulating plate 342B, which is lower than the upper end of the first heat exchange part 34B, the outer diameter may be increased to improve insulating performance.

As described above, since the gas supplied through the first gas supply port 68 and the second gas supply port 72 flows parallel to the wafer 14 formed of Si or SiC and is exhausted through the first gas exhaust port 90, the entire wafer 14 is efficiently and uniformly exposed to the gas.

Figure 6A:
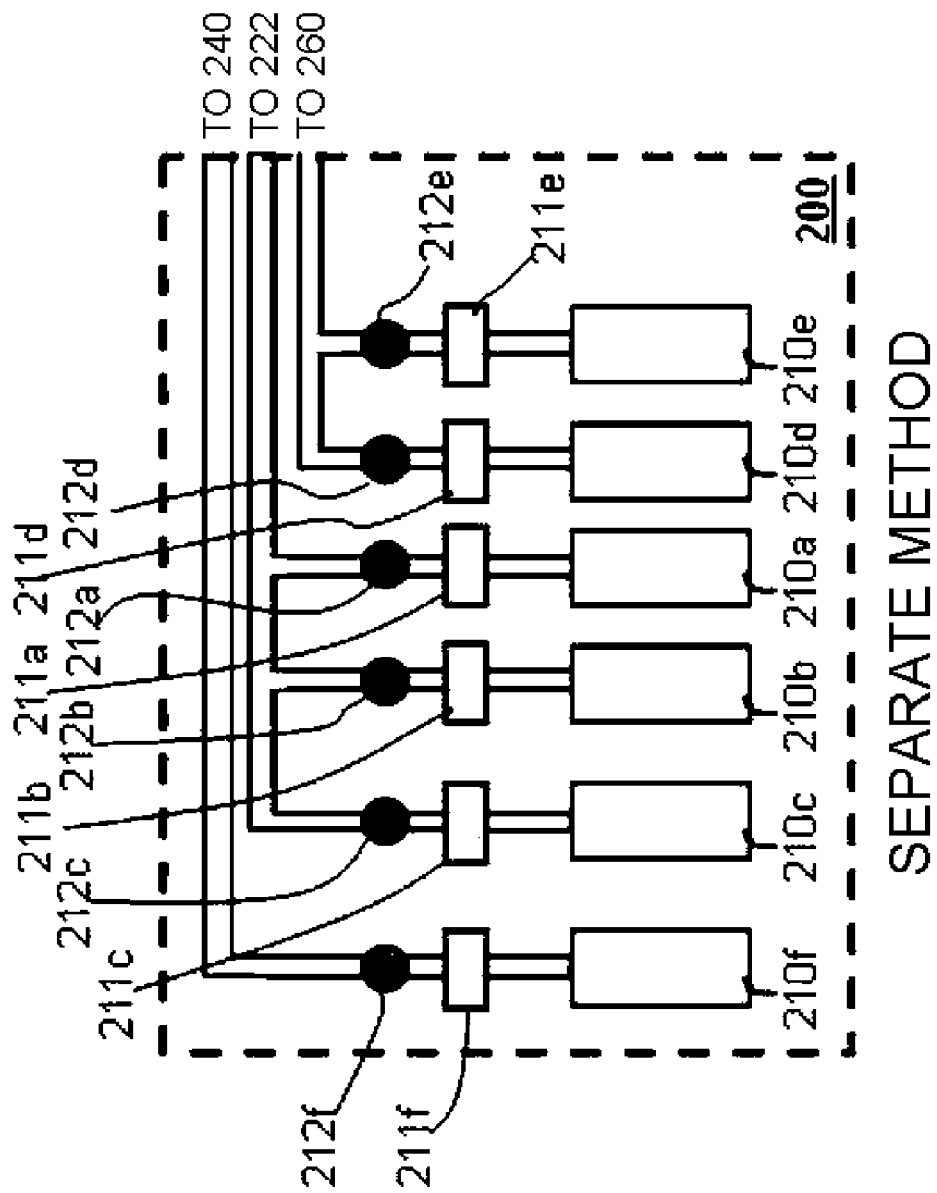
FIGS. 6A and 6B are views for explaining a gas supply unit of a semiconductor manufacturing apparatus to which the present invention is applied.
Figure 6B:
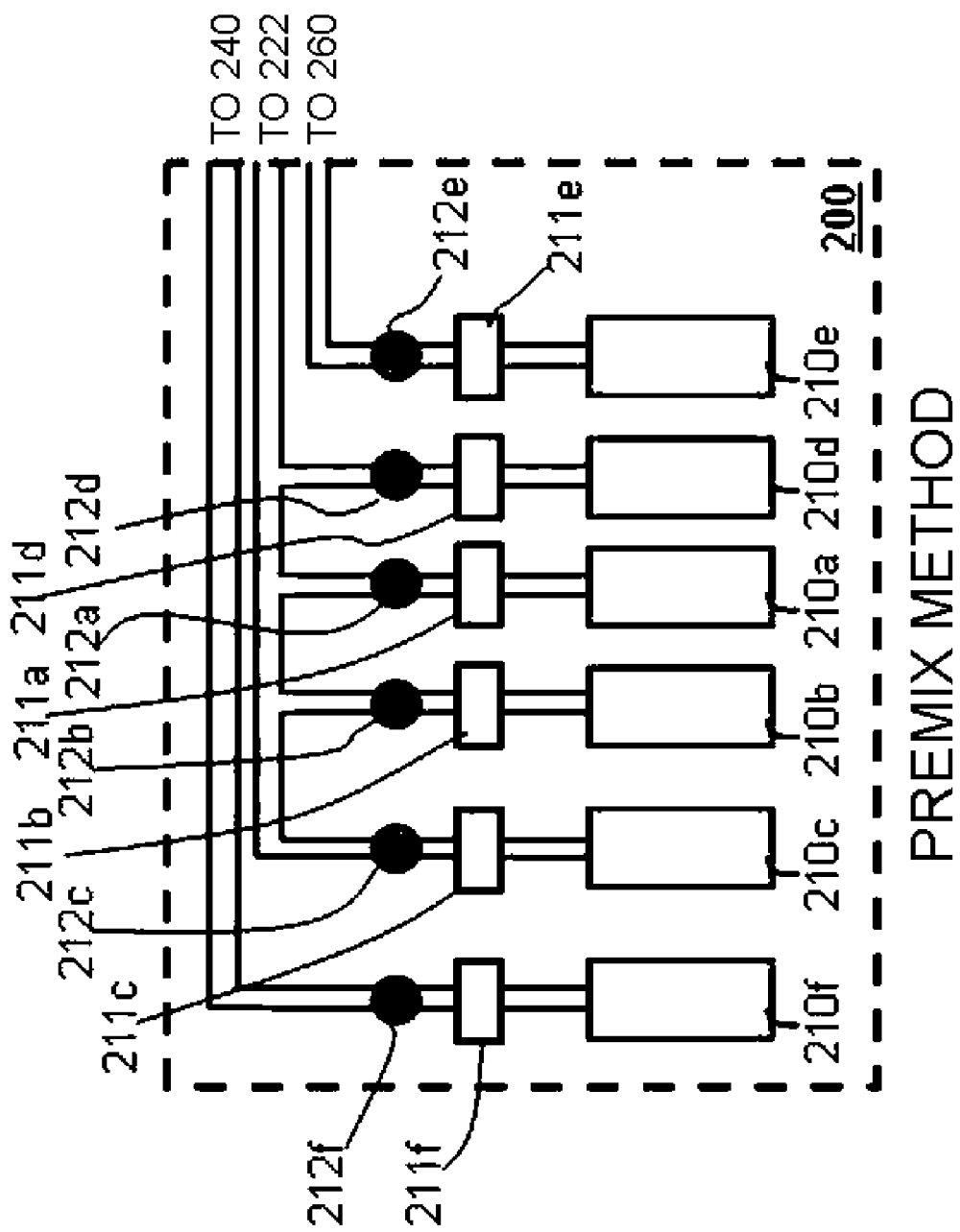

In addition, as shown in FIG. 2, the third gas supply port 360 is installed between the reaction tube 42 and the insulating material 54 and installed to pass through the manifold 36. Further, the second gas exhaust port 390 is disposed between the reaction tube 42 and the insulating material 54 to oppose the third gas supply port 360, and the second gas exhaust port 390 is connected to the gas exhaust pipe 230. The third gas supply port 360 is formed in a third gas line 240 passing through the manifold 36, and the third gas line is connected to the gas supply unit 200. In addition, as shown in FIGS. 6A and 6B, the third gas line is connected to a gas supply source 210f via a valve 212f and an MFC 211f. Ar gas, which is a rare gas, is supplied as an inert gas from the gas supply source 210f to prevent a gas contributing to a SiC epitaxial film growth from entering between the reaction tube 42 and the insulating material 54, preventing attachment of unnecessary byproducts onto an inner wall of the reaction tube 42 or an outer wall of the insulating material 54.

Furthermore, the inert gas supplied between the reaction tube 42 and insulating material 54 is exhausted through the vacuum exhaust apparatus 220 via the APC valve 214 at a downstream side of the gas exhaust pipe 230, rather than the second gas exhaust port 390.

<Specification of Gases Supplied into Gas Supply Systems>

Next, a first gas supply system and a second gas supply system will be described with reference to FIGS. 6A and 6B. FIG. 6A shows a separate method of supplying a silicon atom-containing gas and a carbon atom-containing gas through different gas supply nozzles, and FIG. 6B shows a premix method of supplying a silicon atom-containing gas and a carbon atom-containing gas through the same gas supply nozzle.

First, the separate method will be described. As shown in FIG. 6A, in the separate method, the first gas line 222 is connected to, for example, a $SiH_4$ gas supply source 210a, a HCl gas supply source 210b and an inert gas supply source 210c via mass flow controllers (hereinafter referred to as MFCs) 211a, 211b and 211c, and valves 212a, 212b and 212c, which are flow rate devices (flow rate control units) of $SiH_4$ gas, HCl gas and an inert gas.

According to the above configuration, supply flow rates, concentrations, partial pressures and supply timings of the $SiH_4$ gas, HCl gas and inert gas in the reaction chamber 44 can be controlled. The valves 212a, 212b and 212c and the MFCs 211a, 211b and 211c are electrically connected to a gas flow rate control unit 78, and configured to be controlled at a predetermined timing such that the flow rates of the gases supplied thereto reach predetermined flow rates (see FIG. 7). In addition, the first gas supply system, which is a gas supply system, is constituted by the gas supply sources 210a, 210b and 210c, valves 212a, 212b and 212c, the MFCs 211a, 211b and 211c of the $SiH_4$ gas, HCl gas and inert gas, respectively, the first gas line 222, the first gas supply nozzle 60, and the at least one first gas supply port 68 installed at the first gas supply nozzle 60.

Further, the second gas line 260 is connected to a $C_3H_8$ gas supply source 210d of, for example, $C_3H_8$ gas, which is a carbon atom-containing gas, via an MFC 211d and a valve 212d, which are flow rate control units, and is connected to a $H_2$ gas supply source 210e of, for example, $H_2$ gas, which is a reducing gas, via an MFC 211e and a valve 212e, which are flow rate control units.

According to the above configuration, supply flow rates, concentrations and partial pressures of the $C_3H_8$ gas and $H_2$ gas in the reaction chamber 44 can be controlled. The valves 212d and 212e and the MFCs 211d and 211e are electrically connected to the gas flow rate control unit 78, and configured to be controlled at a predetermined timing such that the flow rates of the supplied gases reach predetermined flow rates (see FIG. 7). In addition, the second gas supply system, which is a gas supply system, is constituted by the gas supply sources 210d and 210e, the valve 212d and 212e, the MFCs 211d and 211e of the $C_3H_8$ gas and $H_2$ gas, the second gas line 260, the second gas supply nozzle 70, and the second gas supply port 72.

As described above, as the silicon atom-containing gas and the carbon atom-containing gas are supplied through different gas supply nozzles, deposition of a SiC film in the gas supply nozzle can be prevented. Further, when concentrations or flow velocities of the silicon atom-containing gas and the carbon atom-containing gas need be adjusted, appropriate carrier gases may be supplied.

In addition, in order to more efficiently use the silicon atom-containing gas, a reducing gas such as hydrogen gas may be used. In this case, the reducing gas may be supplied via the second gas supply nozzle 70 configured to supply the carbon atom-containing gas. As the reducing gas is supplied with the carbon atom-containing gas and mixed with the silicon atom-containing gas in the reaction chamber 44 so that the amount of the reducing gas is reduced, decomposition of the silicon atom-containing gas can be suppressed in comparison with the film-forming, and deposition of the Si Film in the first gas supply nozzle can be suppressed. In this case, the reducing gas can be used as the carrier gas of the carbon atom-containing gas. In addition, since an inert gas (in particular, a rare gas) such as argon (Ar) is used as a carrier of the silicon atom-containing gas, deposition of the Si film can be suppressed.

Further, a chlorine atom-containing gas such as HCl may be supplied through the first gas supply nozzle 60. As a result, even when the silicon atom-containing gas is pyrolyzed to be deposited in the first gas supply nozzle, since an etching mode can be performed by chlorine, deposition of the Si film in the first gas supply nozzle can be further suppressed. Furthermore, since the chlorine atom-containing gas has an effect of etching the deposited film, closing of the first gas supply port 68 can be suppressed.

Next, the premix method shown in FIG. 6B will be described. The premix method is distinguished from the separate method in that the carbon atom-containing gas supply source 210d is connected to the first gas line 222 via the MFC 211d and the valve 212d. Accordingly, since the silicon atom-containing gas and the carbon atom-containing gas can be previously mixed, source gases can be sufficiently mixed in comparison with the separate method.

In this case, the gas supply source 210e of $H_2$, which is a reducing gas, may be connected to the second gas line 260 via the MFC 211e and the valve 212e. Accordingly, since a ratio (Cl/H) of chlorine, which is an etching gas, and hydrogen, which is a reducing gas, in the first gas supply nozzle 60 can be increased, an etching effect by the chlorine can be increased to suppress reaction of the silicon atom-containing gas. Therefore, even in the premix method, deposition of the SiC film can be somewhat suppressed.

In addition, while the HCl gas is exemplified as a chlorine atom-containing gas flowing when the SiC epitaxial film is formed, chlorine gas may be used.

Further, while the silicon atom-containing gas and the chlorine atom-containing gas are supplied when the SiC epitaxial film is formed, a gas including Si atoms and Cl atoms such as tetrachlorosilane (hereinafter referred to as $SiCl_4$) gas, trichlorosilane (hereinafter referred to as $SiHCl_3$) gas, and dichlorosilane (hereinafter referred to as $SiH_2Cl_2$) gas may be supplied. Furthermore, of course, the gas including Si atoms and Cl atoms may be the silicon atom-containing gas, or a mixed gas of the silicon atom-containing and the chlorine atom-containing gas. In particular, since the $SiCl_4$ has a relatively high pyrolysis temperature, the $SiCl_4$ is preferable in consideration of suppression of Si consumption in the nozzle.

In addition, while the $C_3H_8$ gas is exemplified as a carbon atom-containing gas, ethylene (hereinafter referred to as $C_2H_4$) gas or acetylene (hereinafter, referred to as $C_2H_2$) gas may be used.

Further, while the $H_2$ gas is exemplified as a reducing gas, the reducing gas is not limited thereto but another hydrogen atom-containing gas may be used. Furthermore, at least one of rare gases such as Ar (argon) gas, He (helium) gas, Ne (neon) gas, Kr (krypton) gas and Xe (xenon) gas, or a mixed gas thereof may be used as the carrier gas.

<Peripheral Configuration of Processing Furnace>

Figure 9:
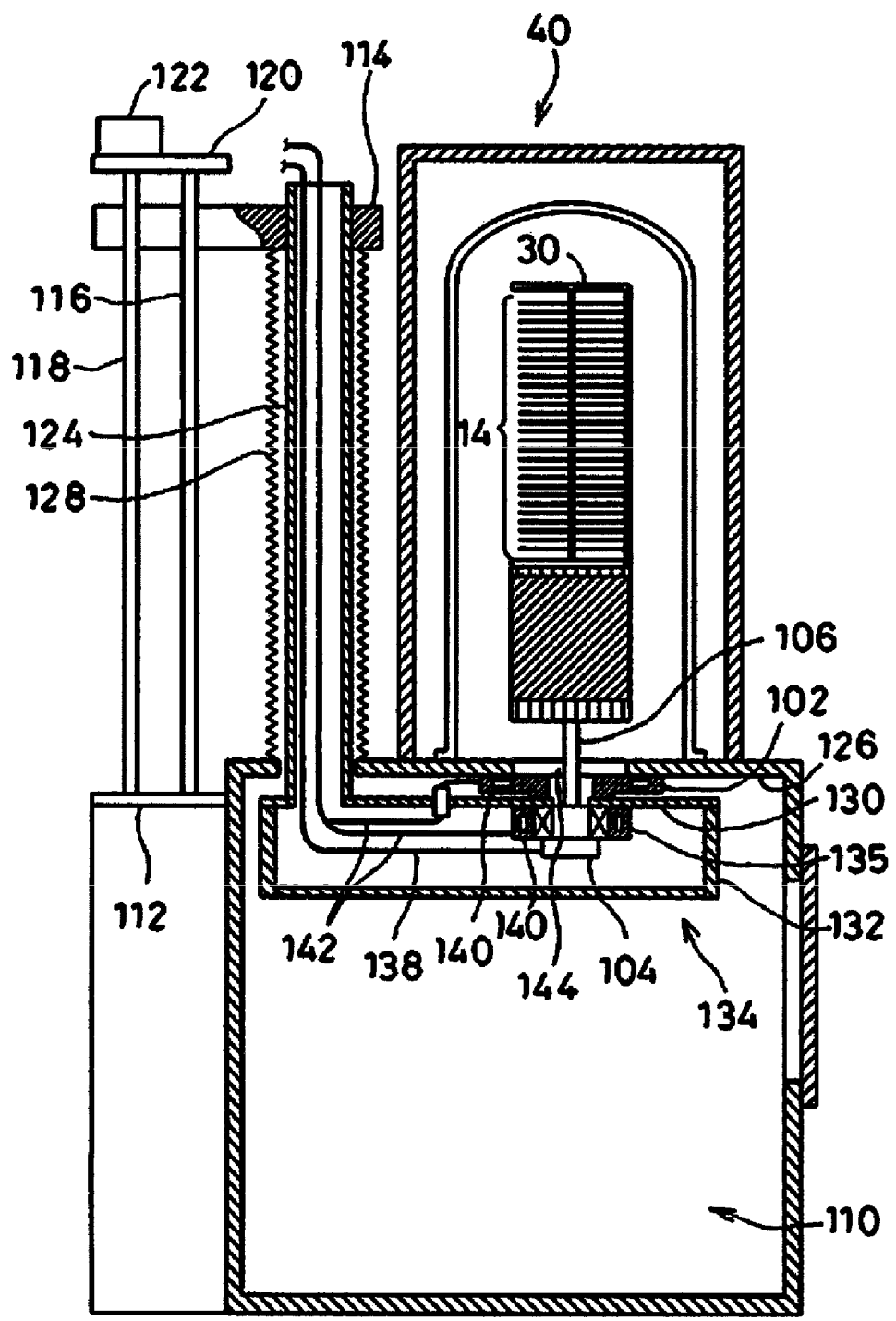
FIG. 9 is a schematic cross-sectional view of the processing furnace and its peripheral structure of the semiconductor manufacturing apparatus to which the present invention is applied.

Next, in FIG. 9, the processing furnace 40 and its peripheral configurations will be described. A seal cap 102, which is a furnace port cover configured to hermetically seal a lower end opening of the processing furnace 40, is installed under the processing furnace 40. The seal cap 102 is formed of a metal material such as stainless steel and has a disc shape. An O-ring (not shown), which is a sealing material in contact with a lower end of the processing furnace 40 is installed at an upper surface of the seal cap 102. A rotary mechanism 104 is installed at the seal cap 102, a rotary shaft 106 of the rotary mechanism 104 is connected to the boat 30 through the seal cap 102, and the rotary mechanism 104 is configured to rotate the wafer 14 through rotation of the boat 30.

In addition, the seal cap 102, which is an elevation mechanism installed outside the processing furnace 40, is configured to be vertically raised and lowered by an elevation motor 122 (described later), and configured to load/unload the boat 30 into/from the processing furnace 40. A drive control unit 108 is electrically connected to the rotary mechanism 104 and the elevation motor 122 and configured such that a predetermined operation is controlled at a predetermined timing (see FIG. 7).

A lower base plate 112 is installed at an outer surface of a load lock chamber 110, which is a preliminary chamber. A guide shaft 116 slidably fitted to an elevation frame 114 and a ball screw 118 threadedly engaged with the elevation frame 114 are installed at the lower base plate 112. In addition, an upper base plate 120 is installed at upper ends of the guide shaft 116 and the ball screw 118 vertically installed at the lower base plate 112. The ball screw 118 is rotated by the elevation motor 122 installed at the upper base plate 120, and the elevation frame 114 is raised and lowered by rotation of the ball screw 118.

A hollow elevation shaft 124 is vertically installed at the elevation frame 114, a connection portion of the elevation frame 114 and the elevation shaft 124 is hermetically sealed, and the elevation shaft 124 is raised and lowered with the elevation frame 114. The elevation shaft 124 moves through a top plate 126 of the load lock chamber 110, and a sufficient gap is provided in a through-hole of the top plate 126, through which the elevation shaft 124 passes, such that the elevation shaft 124 does not contact the top plate 126.

Further, a bellows 128, which is a hollow flexible body having flexibility to cover surroundings of the elevation shaft 124, is installed between the load lock chamber 110 and the elevation frame 114, and the load lock chamber 110 is hermetically maintained by the bellows 128. Furthermore, the bellows 128 has a sufficient flexibility to correspond to an elevation amount of the elevation frame 114, and an inner diameter of the bellows 128 is sufficiently larger than an outer diameter of the elevation shaft 124 such that the elevation shaft 124 does not contact the bellows 128 upon expansion and contraction.

An elevation base plate 130 may be horizontally fixed to a lower end of the elevation shaft 124, and a drive part cover 132 may be hermetically sealed at a lower surface of the elevation base plate 130 via a sealing member such as an O-ring. A drive part receiving case 134 is constituted by the elevation base plate 130 and the drive part cover 132, and thus, the inside of the drive part receiving case 134 is isolated from an atmosphere in the load lock chamber 110.

In addition, the rotary mechanism 104 of the boat 30 is installed in the drive part receiving case 134, and a periphery of the rotary mechanism 104 is cooled by a cooling mechanism 135.

A power cable 138 passes through a hollow portion of the elevation shaft 124 from its upper end, and is guided to be connected to the rotary mechanism 104. Further, a cooling water flow path 140 is formed in the cooling mechanism 135 and the seal cap 102. Furthermore, a cooling water pipe 142 is guided to the cooling water flow path 140 from the upper end of the elevation shaft 124 through the hollow portion to be connected thereto.

As the elevation motor 122 is driven to rotate the ball screw 118, the drive part receiving case 134 is raised and lowered via the elevation frame 114 and the elevation shaft 124.

As the drive part receiving case 134 is raised, the seal cap 102 hermetically installed at the elevation base plate 130 closes the furnace port 144, which is an opening of the processing furnace 40, so that wafer processing becomes possible. In addition, as the drive part receiving case 134 is lowered, the boat 30 is lowered with the seal cap 102 so that unloading of the wafer 14 to the outside becomes possible.

<Control Unit>

Next, in FIG. 7, control configurations of parts constituting the semiconductor manufacturing apparatus 10 for forming a SiC epitaxial film will be described.

The temperature control unit 52, the gas flow rate control unit 78, the pressure control unit 98 and the drive control unit 108 constitute an operation part and an input/output part, and are electrically connected to a main control unit 150 configured to control the entire semiconductor manufacturing apparatus 10. In addition, the temperature control unit 52, the gas flow rate control unit 78, the pressure control unit 98 and the drive control unit 108 constitute a controller 152.

<Method of Forming SiC Film>

Figure 14:
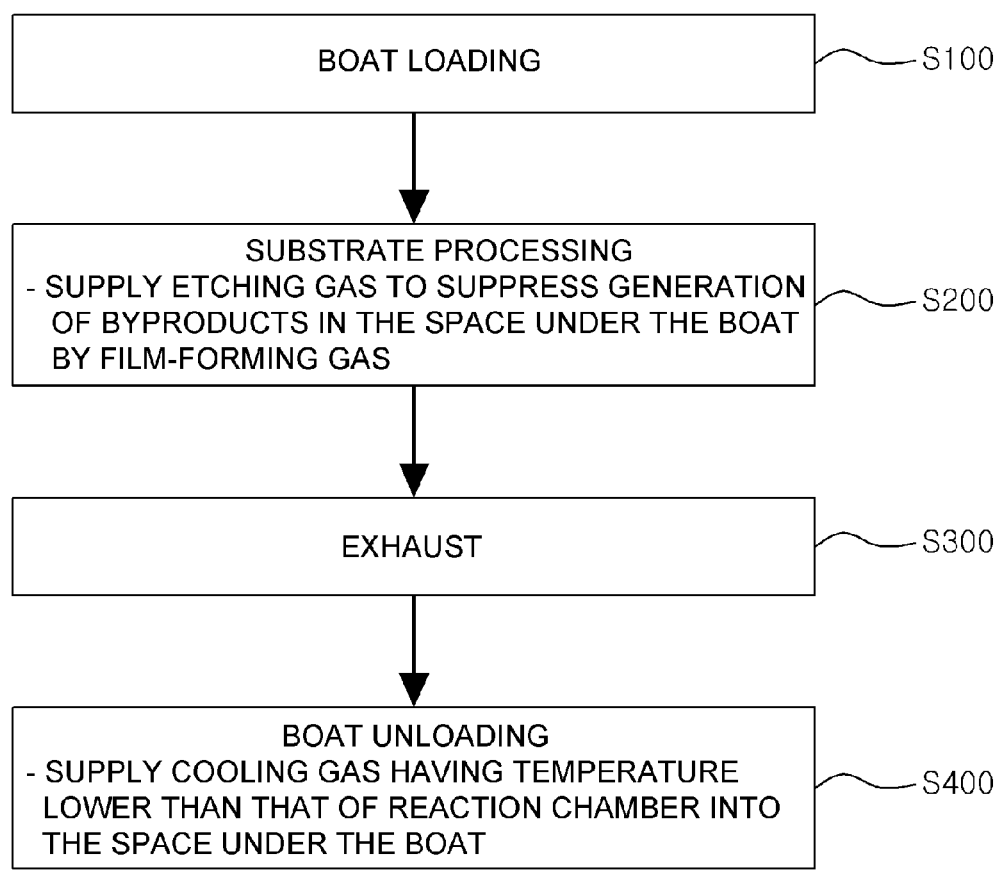
FIG. 14 is an exemplary flowchart of a method of manufacturing a substrate or a method of manufacturing a semiconductor device in accordance with the present invention.

Next, a method of manufacturing a substrate to form, for example, a SiC film on a substrate such as wafer 14 formed of SiC, which is one part of a process of manufacturing a semiconductor device using the semiconductor manufacturing apparatus 10, will be described with reference to FIG. 14. FIG. 14 is an exemplary flowchart of a method of manufacturing a substrate or a method of manufacturing a semiconductor device in accordance with the present invention. In addition, in the following description, operations of parts constituting the semiconductor manufacturing apparatus 10 are controlled by the controller 152.

First, when the pod 16 in which the plurality of wafers 14 are received is set to the pod stage 18, the pod conveyance apparatus 20 conveys the pod 16 from the pod stage 18 to the pod receiving shelf 22 to store the pod 16 thereon. Next, the pod conveyance apparatus 20 conveys the pod 16 stored on the pod receiving shelf 22 to the pod opener 24 to set the pod thereto, the pod opener 24 opens a cover of the pod 16, and the substrate number detector 26 detects the number of wafers 14 received in the pod 16.

Next, the substrate transfer apparatus 28 extracts the wafer 14 from the pod 16 disposed at a position of the pod opener 24 to transfer the wafer 14 to the boat 30.

When the plurality of wafer 14 are charged into the boat 30, the boat 30 holding the wafers 14 is loaded into the reaction chamber 44 by an elevation operation of the elevation frame 114 and the elevation shaft 124 by the elevation motor 122 (boat loading, S100). In this state, the seal cap 102 seals the lower end of the manifold 36 via the O-ring (not shown).

After the boat 30 is loaded, the inside of the reaction chamber 44 is vacuum-exhausted by the vacuum exhaust apparatus 220 to a predetermined pressure (a vacuum degree). At this time, the pressure in the reaction chamber 44 is measured by the pressure sensor (not shown), and the APC valve 214 in communication with the first gas exhaust port 90 and the second gas exhaust port 390 is feedback-controlled based on the measured pressure. In addition, the body to be induced 48 is heated such that the wafer 14 and the inside of the reaction chamber 44 reach a predetermined temperature. Here, a conduction state to the induction coil 50 is feedback-controlled based on the temperature information detected by the temperature sensor (not shown) such that the inside of the reaction chamber 44 reaches a predetermined temperature distribution. Next, as the boat 30 is rotated by the rotary mechanism 104, the wafer 14 is rotated in the circumferential direction.

Next, the silicon atom-containing gas and the chlorine atom-containing gas contributing to a SiC epitaxial growth reaction are supplied from the gas supply sources 210a and 210b, respectively, to be ejected into the reaction chamber 44 through the first gas supply port 68. In addition, after opening angles of the corresponding MFCs 211d and 211e are adjusted such that the carbon atom-containing gas and H$_2$ gas, which is a reducing gas, reach predetermined flow rates, the valves 212d and 212e are opened so that the gases flow through the second gas line 260, flow into the second gas supply nozzle 70, and introduced into the reaction chamber 44 through the second gas supply port 72.

The gas supplied through the first gas supply port 68 and the second gas supply port 72 passes through the inside of the body to be induced 48 in the reaction chamber 44, mainly arrives at an opposite region of the gas supply nozzle, and then, flows downward. Next, as some of the film-forming gas is diffused by the gas discharge part 340, the film-forming gas passes through the gap formed in the circumferential direction of the boat insulating part 34A to be heat exchanged, lowering the temperature. Next, the film-forming gas having a lowered temperature passes through the first gas exhaust port 90 to be exhausted through the gas exhaust pipe 230. The gas supplied through the first gas supply port 68 and the second gas supply port 72 contacts the wafer 14 formed of SiC when the gas passes through the inside of the reaction chamber 44, and the SiC epitaxial film growth on the surface of the wafer 14 is performed (substrate processing, S200).

In addition, after adjusting an opening angle of the corresponding MFC 211f such that Ar gas (a rare gas), which is an inert gas, from the gas supply source 210f reaches a predetermined flow rate, the valve 212f is opened, and the gas flows through the third gas line 240 to be supplied into the reaction chamber 44 through the third gas supply port 360. The Ar gas (a rare gas), which is an inert gas, supplied through the third gas supply port 360 passes between the insulating material 54 in the reaction chamber 44 and the reaction tube 42 to be exhausted through the second gas exhaust port 390 (exhaust, S300).

Next, when a predetermined time elapses, supply of the gas is stopped, the inert gas is supplied from the inert gas supply source (not shown), an inner space of the body to be heated 48 in the reaction chamber 44 is replaced with the inert gas, and the pressure in the reaction chamber 44 returns to a normal pressure.

Next, the seal cap 102 is lowered by the elevation motor 122 to open the lower end of the manifold 36, and in a state in which the processed wafer 14 is held on the boat 30, the wafer 14 is unloaded from the lower end of the manifold 36 to the outside (boat unloading, S400) so that the boat 30 is on standby at a predetermined position when the wafer 14 held on the boat 30 is cooled. When the wafer 14 on the boat 30 on standby is cooled to a predetermined temperature, the substrate transfer apparatus 28 extracts the wafer 14 from the boat 30 and conveys and receives the wafer 14 into an empty pod 16 set to the pod opener 24. Next, the pod conveyance apparatus 20 conveys the pod 16 in which the wafer 14 is received to the pod receiving shelf 22 or the pod stage 18. As a result, a series of operations of the semiconductor manufacturing apparatus 10 is completed.

While the first embodiment has been described with reference to the accompanying drawings, the present invention is not limited thereto but may be variously modified. For example, the number of insulating plates 342A and 342B and the number of columns 343 installed at the gas discharge part 340 may be appropriately varied. In addition, the top plate 341A or the bottom plate 341B may not be installed if unnecessary. In addition, the insulating plate may have a rectangular shape rather than a disc shape.

The first embodiment of the present invention may have at least one of the following effects.

(1) As the cylindrical heat exchange part is installed to form a gap between the cylindrical boat insulating part 34A and the heat exchange part to narrow the exhaust path of the film-forming gas, the temperature of the film-forming gas can be reduced, and the furnace port having a low heat resistance can be protected. In addition, as the gas discharge part 340 having a space formed by the plurality of columns is installed between the boat insulating part 34A and the boat 30, the confluence loss can be suppressed and uniformity of the formed film can be improved.

(2) In (1), as the insulating plate installed parallel to the wafer is installed at the gas discharge part 340, heating of the furnace port by radiant heat from the reaction chamber can be suppressed.

(3) In (2), as the outer diameter of the insulating plate is smaller than that of the bottom plate of the boat, the film-forming gas flowing over the heat exchange part can easily flow in a lateral direction, and the confluence loss can be further effectively suppressed.

(4) In (3), as the outer diameter of the insulating plate disposed under the upper end of the heat exchange part disposed at an opposite side of the gas supply nozzle is larger than that of the insulating plate disposed over the upper end of the heat exchange part disposed at an opposite side of the gas supply nozzle, insulating performance with respect to radiant heat from the reaction chamber can be improved.

(5) In any one of (1) to (4), as the upper end of the boat insulating part is lower than that of the heat exchange part disposed at an opposite side of the gas supply nozzle, the confluence loss can be suppressed.

(6) In (5), as the heat exchange part includes the first heat exchange part disposed at an opposite side of the gas supply nozzle and the second heat exchange part installed under the gas supply nozzle, and the upper end of the second heat exchange part is higher than that of the boat insulating part, heat of the exhausted film-forming gas can be used to heat the film-forming gas passing through the gas supply nozzle.

(7) In addition, according to the first embodiment, the heat exchange part, which defines a flow path narrower than a flow path through which a gas such as the film-forming gas in the reaction chamber flows, is installed between the reaction chamber and the first exhaust port. Further, at the upstream side of the narrower flow path defined by the heat exchange part, a space for discharging gas is disposed to temporarily reduce a pressure of the gas. Accordingly, by improving the uniformity of substrate processing of the wafer surface, uniform films can be formed on the wafer. Further, thermal damages to configuration members in the vicinity of the first exhaust port that have a lower heat-resistance compared to the inside of the reaction chamber such as the manifold or configuration members in the vicinity of the furnace port of the processing furnace such as the O-ring or the seal cap can be reduced.

Second Embodiment

Next, a second embodiment will be described with reference to FIGS. 10 and 11. In addition, here, different parts from the first embodiment are mainly described, and description of the same parts will not be repeated.

Figure 10:
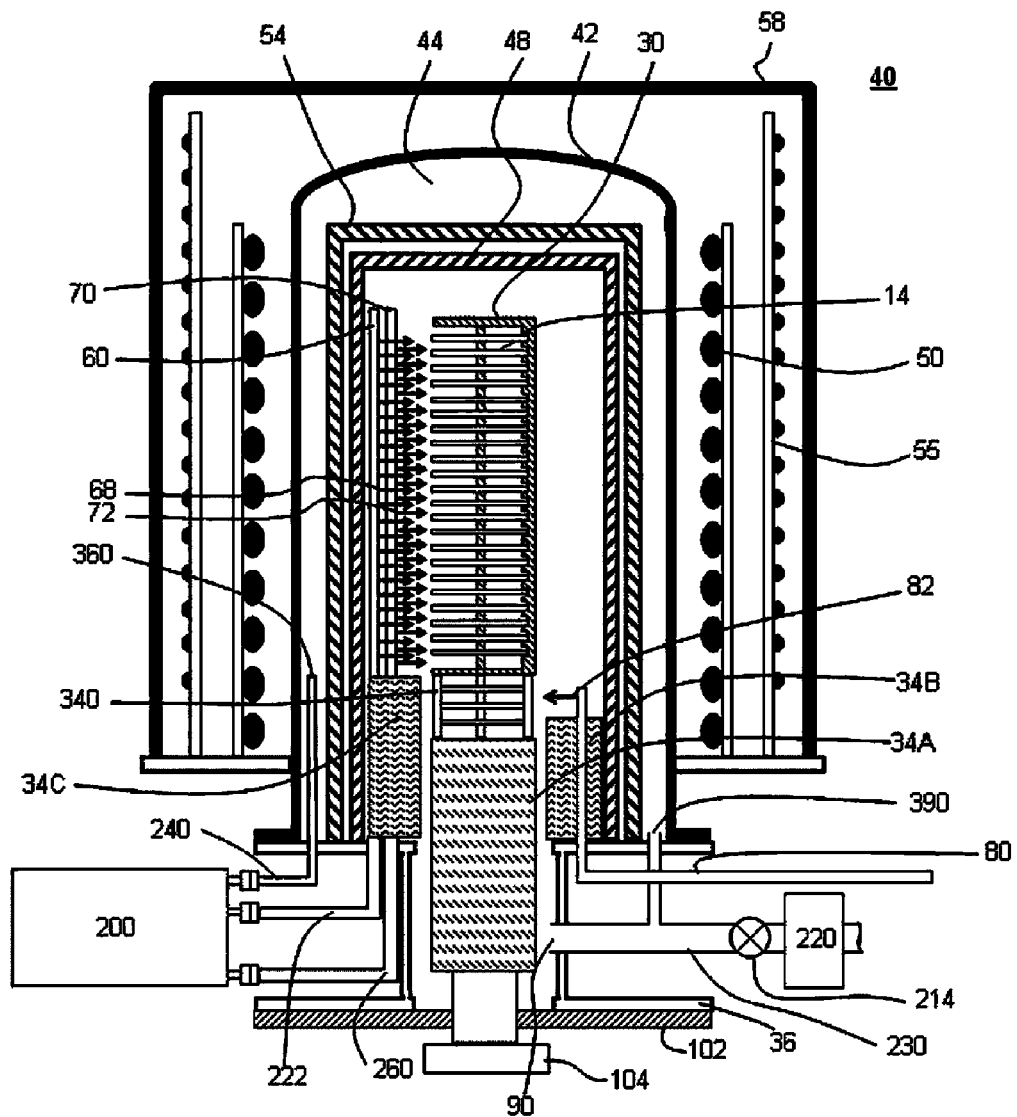
FIG. 10 is another side cross-sectional view of a processing furnace for explaining a second embodiment.

The second embodiment shown in FIG. 10 further includes a fourth gas supply nozzle 80 passing through the first insulating part 34B and configured to supply, for example, a chlorine atom-containing gas. More specifically, an upstream side of the fourth gas supply nozzle 80 passes through the upper surface of the manifold 36 extending in a parallel direction of the wafer, is bent in an L shape, and then is connected to a flow rate control device, a valve and a chlorine atom-containing gas source, which are not shown. In addition, the flow rate control device and the valve are electrically connected to the gas flow rate control unit 78 and configured to be controlled at a predetermined timing such that a flow rate of the gas reaches a predetermined flow rate (see FIG. 7). Accordingly, a supply flow rate, a concentration, a partial pressure and a supply timing of the chlorine atom-containing gas in the reaction chamber 44 can be controlled. In addition, a fourth gas supply port 82 configured to supply a chlorine atom-containing gas is installed at a downstream side of the fourth gas supply nozzle 80 at a position higher than the upper end of the boat insulating part 34A, more preferably, a position at which the gas discharge part 340 is located. Accordingly, the chlorine atom-containing gas supplied through the fourth gas supply port 82 enters the reaction chamber 44, and then, similarly to the film-forming gas, passes through the gap between the boat insulating part 34A and the first and second heat exchange parts 34B and 34C to be exhausted through the first exhaust port 90.

Next, reasons for supplying the chlorine atom-containing gas through the fourth gas supply nozzle 80 will be described. As described in the first embodiment, the film-forming gas passing through the reaction chamber 44 is exhausted through the gap between the boat insulating part 34A and the first and second heat exchange parts 34B and 34C. Accordingly, byproducts such as a SiC film are attached to sidewalls of the boat insulating part 34A, the first heat exchange part 34B and the second heat exchange part 34C. In addition, since the film-forming temperature of the parts is lowered, film quality can be deteriorated and particles can be easily generated. In the embodiment, the chlorine atom-containing gas, which is an etching gas, is supplied through the fourth gas supply nozzle 80 to suppress attachment of byproducts to the boat insulating part 34A, the first heat exchange part 34B and the second heat exchange part 34C.

In addition, the fourth gas supply port 82 is installed at a position where the gas discharge part 340 is located. Accordingly, the chlorine atom-containing gas supplied through the fourth gas supply port 82 can pass through the gas discharge part 340 to easily arrive at the second heat exchange part 34C. Further, in a configuration in which the gas discharge part 340 is not installed as shown in FIG. 8, even when the fourth gas supply nozzle 80 is installed like the embodiment, the gas is blocked by the boat insulating part 34A and the gas cannot easily arrive at the second heat exchange part 34C. Accordingly, as the gas discharge part 340 is installed and the gas supply port configured to supply an etching gas is installed at a height where the gas discharge part 340 is positioned, attachment of byproducts to the exhaust system can be efficiently suppressed.

In addition, the flow velocity of the etching gas supplied through the fourth gas supply port 82 may be lower than that of the film-forming gas supplied through the first gas supply nozzle 60 or the second gas supply nozzle 70. While the film-forming gas supplied through the first gas supply nozzle 60 or the second gas supply nozzle needs to be reduced in quantity flowing in the exhaust direction before arrival at the wafer 14, as the velocity of the etching gas supplied through the fourth gas supply port 82 is reduced, some of the etching gas flows in the exhaust direction just after ejection toward the fourth gas supply port 82, and thus, the etching gas may be supplied into the gap between the boat insulating part 34A and first heat exchange part 34B at a side in which the fourth gas supply nozzle is installed.

Figure 11:
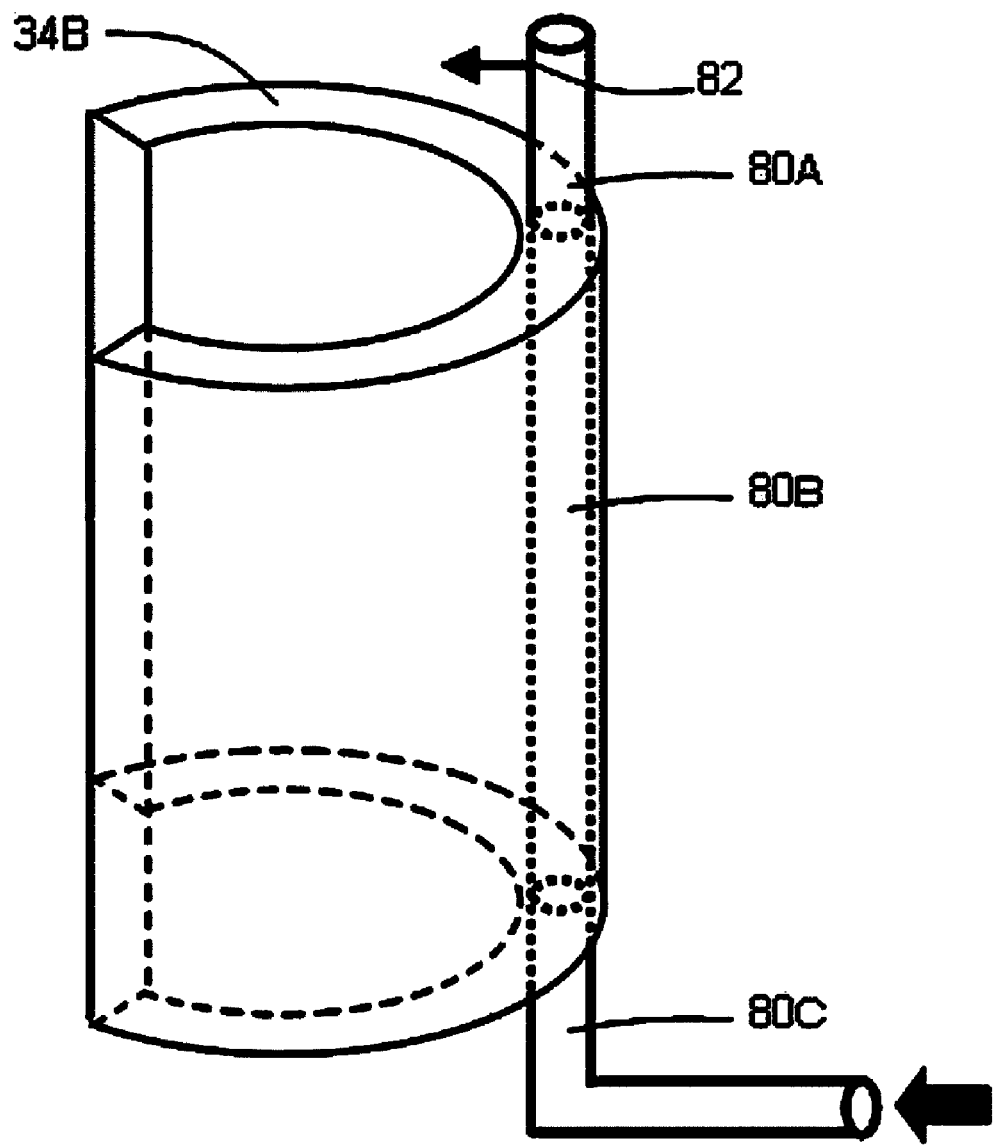
FIG. 11 is a schematic view of an example of a first heat exchange part of the second embodiment.

FIG. 11 is a schematic view showing a relationship between the first heat exchange part 34B and the fourth gas supply nozzle 80. The first heat exchange part 34B has a C-shaped cylindrical member and a hollow structure to suppress heat transfer. In addition, the first heat exchange part 34B includes a tubular flow path 80B configured to supply an etching gas. Further, a first gas supply pipe 80C, which is a separate member from the first heat exchange part 34B, is connected to an upstream side of the flow path 80B, and a second gas supply pipe 80A in which a fourth gas supply port 82 is installed is connected to a downstream side of the flow path 80B. The fourth gas supply nozzle 80 is constituted by the first gas supply port 80C, the flow path 80B and the second gas supply pipe 80A. Of course, the fourth gas supply nozzle 80 may be formed as an integral body and inserted into a hole formed in the first heat exchange part 34B. However, when the fourth gas supply nozzle 80 is inserted into the first heat exchange part 34B, there is a probability of a gap between the fourth gas supply nozzle 80 and the hole formed in the first heat exchange part 34B. Meanwhile, as shown in FIG. 11, as the fourth gas supply nozzle 80 is connected to the flow path 80B installed to pass through the first heat exchange part, and the first gas supply pipe 80C and the second gas supply pipe 80A are connected to the flow path 80B to form a hermetical fitting portion, flowing of the etching gas into the first heat exchange part can be suppressed. In addition, while not shown, when the insulating plate is installed in the first heat exchange part in a direction parallel to the wafer surface, insulating performance is further improved.

The etching gas is supplied through the fourth gas supply port 82 while at least the substrate is processed (in the first embodiment, while the SiC epitaxial film growth is performed). Accordingly, attachment of byproducts to the boat insulating part 34A, the first heat exchange part 34B and the second heat exchange part 34C can be suppressed. Further, in a process of lowering a temperature, the etching gas or a cooling gas such as argon (Ar) instead of the etching gas may be supplied. As the cooling gas is supplied, a temperature-lowering time can be reduced.

While the second embodiment has been described with reference to the accompanying drawings, the present invention is not limited thereto but may be variously modified. For example, the fourth gas supply nozzle 80 may be installed in plural. In this case, the fourth gas supply nozzles 80 may be disposed in the circumferential direction, and the fourth gas supply port 82 may supply the etching gas toward a center of the boat insulating part 34A to uniformly supply the etching gas.

In addition, the etching gas supplied through the fourth gas supply nozzle 80 has an effect of suppressing deposition of byproducts. In addition, hydrogen chloride gas (HCl gas) and chlorine gas ($Cl_2$ gas) may be used as examples of a chlorine atom-containing gas, which is an etching gas.

The second embodiment of the present invention has at least one of the following effects, in addition to the effects of the first embodiment of the present invention.

(1) As the fourth gas supply nozzle 80 configured to supply an etching gas is installed at a downstream side of the reaction chamber 44, attachment of byproducts to a downstream side of the reaction chamber 44 can be suppressed.

(2) In (1), as the height of the fourth gas supply port 82 is disposed at a position over the upper end of the boat insulating part 34A, the etching gas can easily arrive at the heat exchange part installed under the gas supply nozzle via the gas discharge part 340. In this case, as the height of the fourth gas supply port 82 is disposed at a position where the gas discharge part 340 is disposed, the etching gas can more easily arrive at the heat exchange part installed under the gas supply nozzle.

(3) In (1) or (2), as the flow velocity of the etching gas supplied through the fourth gas supply port is lower than that of the film-forming gas supplied through the first gas supply port 68 and the second gas supply port 72, the etching gas can be efficiently supplied between the boat insulating part 34A and the heat exchange part 34B installed at an opposite side of the gas supply nozzle.

(4) In any one of (1) to (3), as the fourth gas supply nozzle 80 is constituted by the flow path 80B installed at the first heat exchange part 34B, the first gas supply pipe 80C connected to an upstream side of the flow path 80B, and the second gas supply pipe 80A connected to a downstream side of the flow path 80B, flowing of the etching gas into the heat exchange part can be suppressed.

(5) In addition, as the etching gas is supplied through the fourth gas supply port 82 while the substrate is processed, generation of byproducts to a downstream side of the reaction chamber can be suppressed and a decrease in yield due to the byproducts can be suppressed.

(6) In (5), as an etching gas or a cooling gas having a temperature lower than that in the reaction chamber such as argon gas is supplied through the fourth gas supply nozzle 80 during a temperature-lowering process, a temperature-lowering time can be reduced and throughput can be improved.

Third Embodiment

Next, a third embodiment will be described with reference to FIGS. 12A, 12B, 13A and 13B. In addition, here, different parts from the first and second embodiments are mainly described and description of the same parts will not be repeated.

FIGS. 12A and 12B are schematic views for explaining the third embodiment. In addition, like elements in the first embodiment and the second embodiment are designated by like reference numerals. The third embodiment is distinguished from the first embodiment and the second embodiment in that the third embodiment includes an adjustment block 345. As shown in FIG. 12A, the adjustment block 345 is installed at the bottom plate 30B of the boat 30 to narrow a space between the lowermost wafer of the plurality of wafers and the bottom plate 30B of the boat 30. As shown in FIG. 12B, the adjustment block 345 has a size to be accommodated inside a plurality of boat columns 30A disposed in the circumferential direction, and preferably has a disc shape. As the adjustment block 345 has the size to be accommodated inside the boat columns 30A, the adjustment block 345 can be separated therefrom. In addition, as the adjustment block 345 has the disc shape, conditions are not varied according to a rotational position of the boat 30.

As described in the first embodiment, even when a velocity of the film-forming gas ejected through the plurality of gas supply ports 68 or 72 is constant, the confluence loss occurs in a lower region of the boat, and the flow velocity of the film-forming gas is lowered in the lower region of the boat. Accordingly, in the embodiment, the adjustment block 345 is installed at the bottom plate 30B of the boat 30 to narrow a flowing space of the film-forming gas passing under the lowermost wafer 14 of the boat 30. Accordingly, the film-forming gas supplied through the lowermost end of the gas supply port 68 or 72 cannot easily pass through the flowing space because the flowing space is narrowed. For this reason, some of the film-forming gas supplied through the lowermost end of the gas supply port 68 or 72 flows toward an upper side having a relatively wide flowing space. As a result, since the film-forming gas flowing upward through the lowermost end is increased in flow velocity on the wafer surface in the lower region of the boat, a decrease in flow velocity due to the confluence loss can be supplemented, and thus, flow velocities of the film-forming gas may be substantially equal in the upper region and the region of the boat 30. In addition, since a gas supply amount to the lowermost wafer 14 is reduced, the lowermost wafer 14 cannot be used as a product. Accordingly, a dummy wafer may be provided.

Figure 13A:
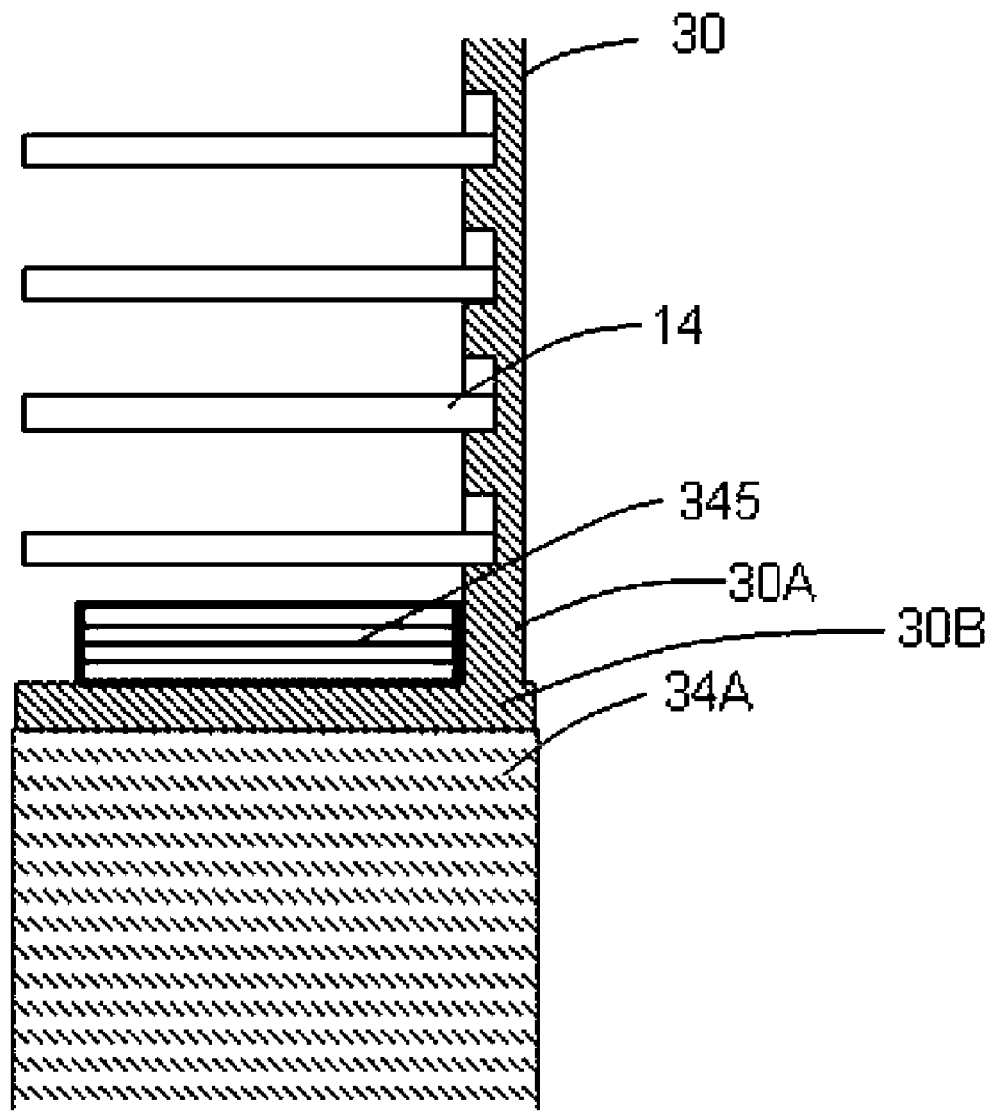
FIGS. 13A to 13B are schematic views for explaining a variant of the third embodiment.
Figure 13B:
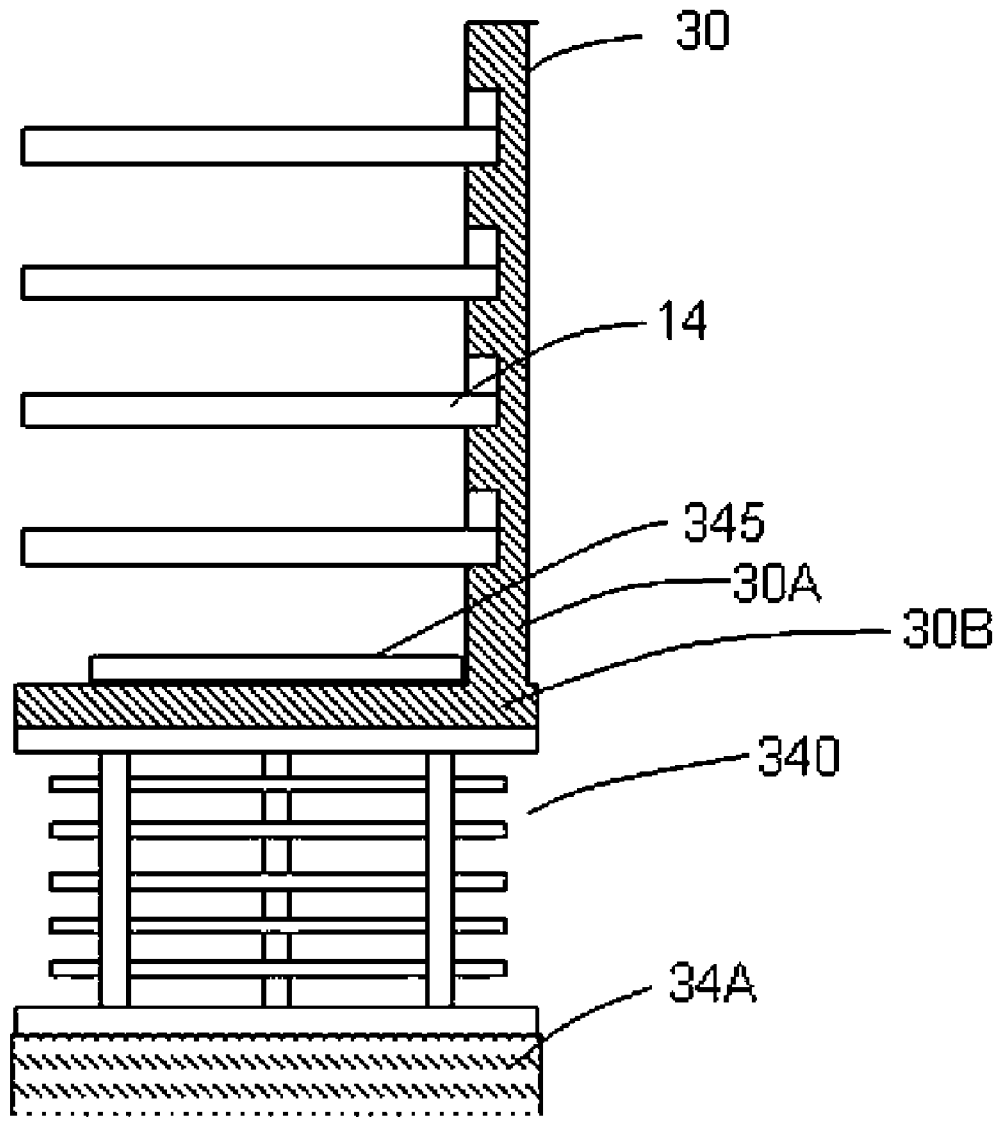

Further, while FIGS. 12A and 12B show the adjustment block 345 as one plate, as shown in FIG. 13A, a plurality of plates may be stacked. As a result, as the number of the adjustment blocks 345 is adjusted, an arbitrary size of space can be formed. Accordingly, even when a flow rate of the film-forming gas supplied through the gas supply port 68 or 72 is varied, the adjustment can be easily performed. In addition, as shown in FIG. 13B, the adjustment block may be used with the configuration in which the gas discharge part 340 described in the first embodiment is installed. Most of the confluence loss is solved by the gas discharge part 340 of the first embodiment and the adjustment block 345 of the embodiment performs fine adjustment so that a more uniform SiC epitaxial growth film can be formed.

While the third embodiment has been described with reference to the accompanying drawings, the present invention is not limited thereto but may be variously modified. For example, while the adjustment block 345 having a disc shape has been described, the adjustment block 345 may have a conical shape.

The third embodiment of the present invention includes at least one of the following effects, in addition to the effects of the first embodiment or the second embodiment of the present invention.

(1) As the adjustment block 345 is installed at the bottom plate 30B of the boat 30 to narrow the flowing space of the lowermost end, a flow velocity of the film-forming gas with respect to another wafer in the lower region of the boat can be increased. As a result, a decrease in flow velocity due to the confluence loss can be supplemented, and a uniform flow velocity between the upper region and the lower region of the boat can be realized.

(2) In (1), the adjustment block 345 has a size accommodated inside the boat columns 34A parallel to the circumferential direction to enable easy separation thereof.

(3) In (2), as the adjustment block 345 is constituted by the plurality of plate members, which overlap each other, the size of the flowing space can be easily adjusted.

(4) In any one of (1) to (3), as the adjustment block 345 has a disc shape, a difference in conditions according to a rotational position of the boat can be suppressed.

(5) In any one of (1) to (4), as the gas discharge part 340 is installed between the boat 30 and the boat insulating part 34A, the confluence loss can be more effectively suppressed.

While the present invention has been described with reference to the accompanying drawings, the present invention may be variously modified without departing from the spirit of the present invention. For example, since the present invention was devised in a review step of the SiC epitaxial growth apparatus, the embodiment has also described the SiC epitaxial growth apparatus. However, the embodiment is not limited thereto but may be applied to the entire substrate processing apparatus in which the confluence loss occurs.

In addition, the space for discharging gas is not limited to the case where the space is formed integrally with the boat. For example, a configuration member defining the space for discharging gas can be disposed separately from the boat. Further, the space for discharging gas, which is one of the configuration members constituting the processing furnace, may be installed at the upstream side of the narrower flow path defined by the heat exchange part.

Major examples of the present invention described in the specification will be supplementarily noted.

[Supplementary Note 1]

A substrate processing apparatus including: a reaction chamber configured to process a plurality of substrates; a boat configured to hold the plurality of substrates; a gas supply nozzle including a gas supply port configured to supply a film-forming gas to the plurality of substrates; an exhaust port configured to exhaust the film-forming gas from the reaction chamber; a heat exchange part installed at a lower portion of the reaction chamber, the heat exchange part defining a second flow path narrower than a first flow path defined by an inner wall of the reaction chamber and the boat; and a gas discharge part installed below a lowermost substrate of the plurality of substrates loaded in the boat, the gas discharge part including a plurality of columns defining a space between the lowermost substrate and the heat exchange part.

[Supplementary Note 2]

The substrate processing apparatus according to Supplementary Note 1, wherein gas discharge part further comprises a first insulating plate installed parallel to a surface of each of the plurality of substrates.

[Supplementary Note 3]

The substrate processing apparatus according to Supplementary Note 2, wherein an outer diameter of the first insulating plate is smaller than that of a bottom plate of the boat.

[Supplementary Note 4]

The substrate processing apparatus according to supplementary note 3, wherein the heat exchange part includes a boat insulating part having a cylindrical shape disposed under the boat; and a first heat exchange part having a cylindrical shape, the first heat exchange part being spaced apart from the boat insulating part to surround at least a portion of a side surface of the boat insulating part, and wherein the gas discharge part is installed between the boat insulating part and the boat, an upper end of the first heat exchange part is higher than that of the boat insulating part, the first insulating plate may be installed at a position higher than the upper end of the first heat exchange part, the gas discharge part is installed at a position lower than the upper end of the first heat exchange part, and the gas discharge part further includes a second insulating plate having an outer diameter larger than that of the first insulating plate.

[Supplementary Note 5]

The substrate processing apparatus according to Supplementary Note 1, wherein the heat exchange part includes a boat insulating part having a cylindrical shape disposed under the boat; and a first heat exchange part having a cylindrical shape, the first heat exchange part being spaced apart from the boat insulating part to surround at least a portion of a side surface of the boat insulating part, and wherein the gas discharge part is installed between the boat insulating part and the boat, and an upper end of the first heat exchange part is higher than that of the boat insulating part.

[Supplementary Note 6]

The substrate processing apparatus according to Supplementary Note 5, wherein the heat exchange part further includes a second heat exchange part installed under the gas supply nozzle along at least a portion of the side surface of the boat insulating part, the second heat exchange part being spaced apart from the boat insulating part, and the first heat exchange part is disposed at an opposite side of the second heat exchange part with the gas supply nozzle and the boat disposed therebetween, and an upper end of the second heat exchange part is higher than that of the boat insulating part.

[Supplementary Note 7]

The substrate processing apparatus according to Supplementary Note 1, wherein the heat exchange part includes a boat insulating part having a cylindrical shape disposed under the boat; and a first heat exchange part having a cylindrical shape, the first heat exchange part being spaced apart from the boat insulating part to surround at least a portion of a side surface of the boat insulating part, and wherein the gas discharge part is installed between the boat insulating part and the boat, the substrate processing apparatus further includes a second gas supply nozzle installed at the first heat exchange part, the second gas supply nozzle including a second gas supply port configured to supply an etching gas, and the second gas supply port is higher than the upper end of the boat insulating part.

[Supplementary Note 8]

The substrate processing apparatus according to Supplementary Note 7, wherein the second gas supply port is installed at a position where the gas discharge part is located.

[Supplementary Note 9]

The substrate processing apparatus according to Supplementary Note 7 or 8, wherein a flow velocity of the etching gas supplied through the second gas supply port is lower than that of the film-forming gas supplied through the first gas supply port.

[Supplementary Note 10]

The substrate processing apparatus according to any one of Supplementary Notes 7 to 9, wherein the second gas supply nozzle includes a pipe penetrating the first heat exchange part to define a flow path; a first gas supply pipe connected to an upstream side of the pipe; and a second gas supply pipe installed at a downstream side of the pipe.

[Supplementary Note 11]

The substrate processing apparatus according to Supplementary Note 10, wherein the first gas supply pipe is connected to a supply source of the etching gas and a supply source of a cooling gas having a temperature lower than that of the reaction chamber when the plurality of substrates are processed.

[Supplementary Note 12]

The substrate processing apparatus according to any one of Supplementary Notes 1 to 11, further including an adjustment block installed at a bottom plate of the boat.

[Supplementary Note 13]

The substrate processing apparatus according to Supplementary Note 12, wherein the adjustment block is disposed inside the plurality of columns disposed parallel to a circumferential direction on the bottom plate.

[Supplementary Note 14]

The substrate processing apparatus according to Supplementary Note 13, wherein the adjustment block includes a plurality of overlapping plate members.

[Supplementary Note 15]

The substrate processing apparatus according to any one of Supplementary Notes 12 to 14, wherein the adjustment block includes a disc-shaped member.

[Supplementary Note 16]

A substrate processing apparatus including: a reaction chamber configured to process a plurality of substrates; a boat configured to hold the plurality of substrates; a gas supply nozzle including a gas supply port configured to supply a film-forming gas to the plurality of substrates; an exhaust port configured to exhaust the film-forming gas from the reaction chamber; a heat exchange part installed at a lower portion of the reaction chamber, the heat exchange part defining a second flow path narrower than a first flow path defined by an inner wall of the reaction chamber and the boat; and an adjustment block disposed on a bottom plate of the boat.

[Supplementary Note 17]

A method of manufacturing a substrate or a method of manufacturing a semiconductor device, including: (a) loading into a reaction chamber a boat holding a plurality of substrates; (b) supplying a film-forming gas to the plurality of substrate in the reaction chamber to process the plurality of substrates; (c) exhausting the film-forming gas in the reaction chamber via a first flow path defined by an inner wall of the reaction chamber and the boat and a second flow path narrower than the first flow path defined by a space under the boat and a heat exchange part; and (d) unloading the plurality of substrates from the reaction chamber.

[Supplementary Note 18]

The method according to Supplementary Note 17, wherein step (b) includes supplying an etching gas to suppress a generation of byproducts in the space under the boat by the film-forming gas.

[Supplementary Note 19]

The method according to Supplementary Note 18, wherein step (d) includes supplying a cooling gas having a temperature lower than that of the reaction chamber into the space under the boat.

What is claimed is:

1. A substrate processing apparatus comprising:
   a reaction chamber configured to process a plurality of substrates;
   a boat configured to hold the plurality of substrates;
   a boat heat-insulating part having a cylindrical shape disposed under the boat;
   a gas supply nozzle including a gas supply port configured to supply a film-forming gas to the plurality of substrates;
   an exhaust port configured to exhaust the film-forming gas from the reaction chamber;
   a heat exchange part installed under the boat heat-insulating part wherein the heat exchange part defining a second flow path narrower than a first flow path defined by an inner side wall of the reaction chamber and the boat and configured to exchange heat with the film-forming gas supplied into the reaction chamber, the heat exchange part comprising a first heat exchange part having a cylindrical shape, the first heat exchange part being spaced apart from the boat heat-insulating part and surrounding at least a portion of a side surface of the boat heat-insulating part, wherein an upper end portion of the heat exchange part is lower than a lowermost portion of the boat and an upper end of the first heat exchange part is higher than that of the boat heat-insulating part; and
   a gas discharge part installed between the lowermost portion of the boat and a top portion of the boat heat-insulating part, the gas discharge part including a plurality of columns defining a space between the lowermost portion of the boat and the heat exchange part.

* * * * *